(12) United States Patent
Wu et al.

(10) Patent No.: US 11,158,644 B2
(45) Date of Patent: Oct. 26, 2021

(54) SEMICONDUCTOR DEVICE WITH FIELD EFFECT TRANSISTORS OF DIFFERING GATE DIELECTRIC THICKNESS ON THE SAME SUBSTRATE AND METHOD OF MANUFACTURING THE SAME

(71) Applicant: Taiwan Semiconductor Manufacturing Co., Ltd., Hsinchu (TW)

(72) Inventors: Wei-Cheng Wu, Hsinchu County (TW); Hung-Pin Ko, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 48 days.

(21) Appl. No.: 16/527,044

(22) Filed: Jul. 31, 2019

(65) Prior Publication Data

US 2020/0043939 A1    Feb. 6, 2020

Related U.S. Application Data

(60) Provisional application No. 62/712,223, filed on Jul. 31, 2018.

(51) Int. Cl.
*H01L 27/11526*    (2017.01)
*G11C 16/08*    (2006.01)
*G11C 16/04*    (2006.01)

(52) U.S. Cl.
CPC .... *H01L 27/11526* (2013.01); *G11C 16/0441* (2013.01); *G11C 16/08* (2013.01)

(58) Field of Classification Search
CPC .................................................. H01L 27/11526
USPC ........................................................... 257/368
See application file for complete search history.

(56) References Cited

U.S. PATENT DOCUMENTS

| | | | |
|---|---|---|---|
| 6,436,749 B1 * | 8/2002 | Tonti ............... | H01L 21/823842 |
| | | | 257/E21.637 |
| 8,796,666 B1 | 8/2014 | Huang et al. | |
| 8,815,712 B2 | 8/2014 | Wan et al. | |
| 8,963,258 B2 | 2/2015 | Yu et al. | |
| 9,093,530 B2 | 7/2015 | Huang et al. | |
| 9,171,929 B2 | 10/2015 | Lee et al. | |
| 9,214,555 B2 | 12/2015 | Oxland et al. | |
| 9,236,267 B2 | 1/2016 | De et al. | |
| 9,520,482 B1 | 12/2016 | Chang et al. | |
| 9,548,303 B2 | 1/2017 | Lee et al. | |
| 9,576,814 B2 | 2/2017 | Wu et al. | |
| 2016/0358919 A1 * | 12/2016 | Chen ............... | H01L 21/823418 |

\* cited by examiner

*Primary Examiner* — Ajay Arora
(74) *Attorney, Agent, or Firm* — JCIPRNET

(57) ABSTRACT

Provided are a semiconductor device and a method of manufacturing the same. The semiconductor device includes a substrate, a first FET, and a second FET formed over the substrate. The substrate has a first surface and a second surface, and the first surface and the second surface form a step. The first FET comprises a first gate dielectric layer over the first surface of the substrate. The second FET comprises a second gate dielectric layer thinner than the first gate dielectric layer over the second surface of the substrate.

20 Claims, 22 Drawing Sheets

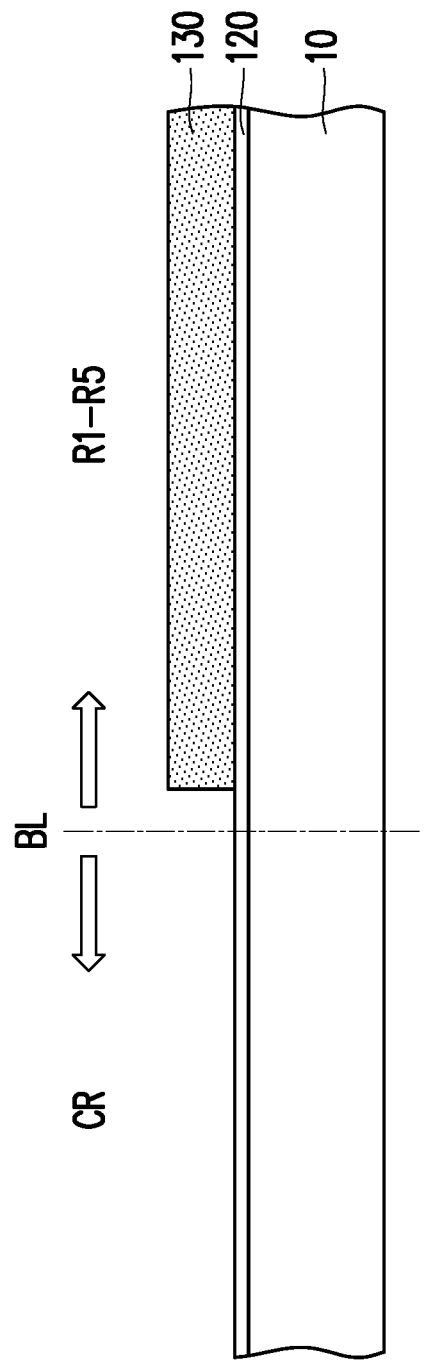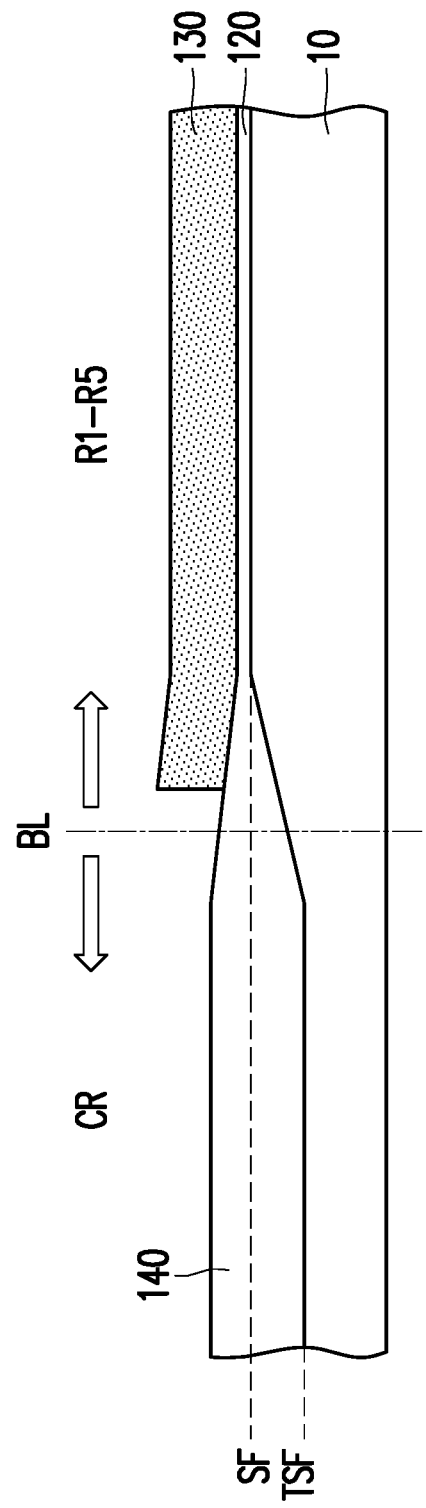

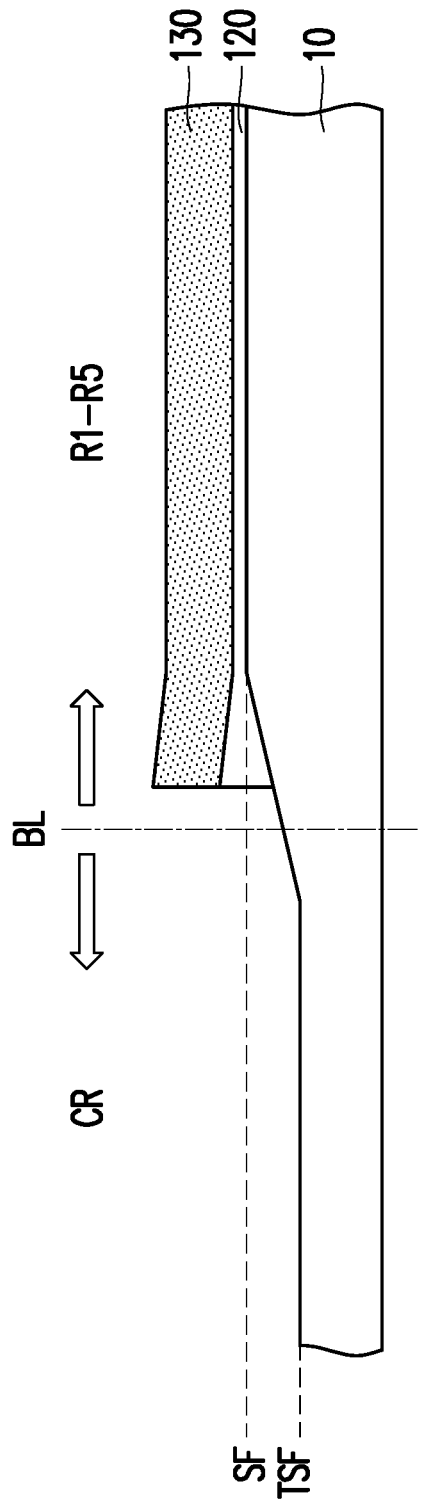
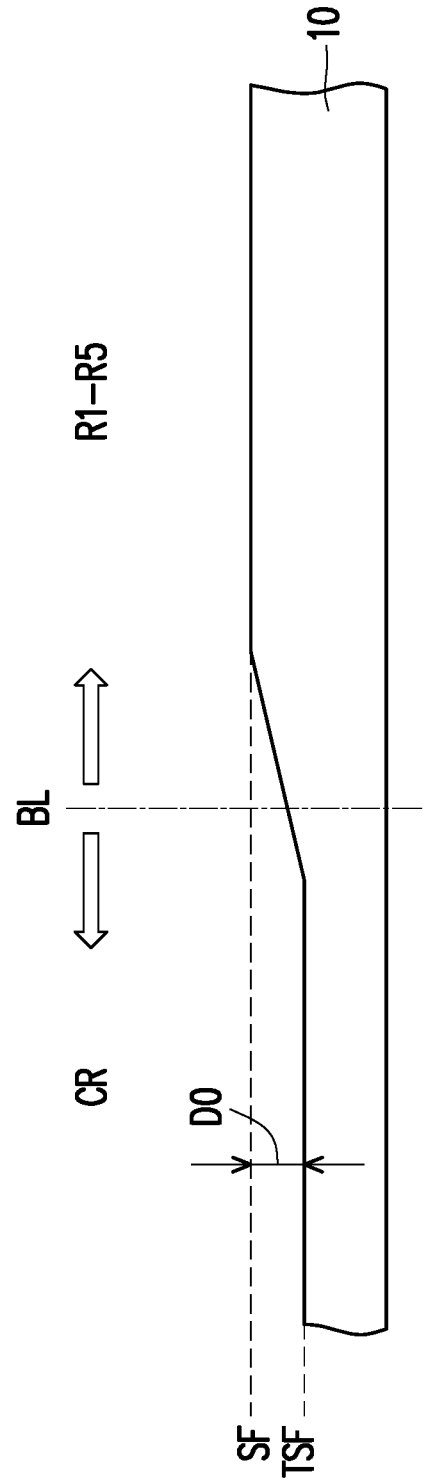

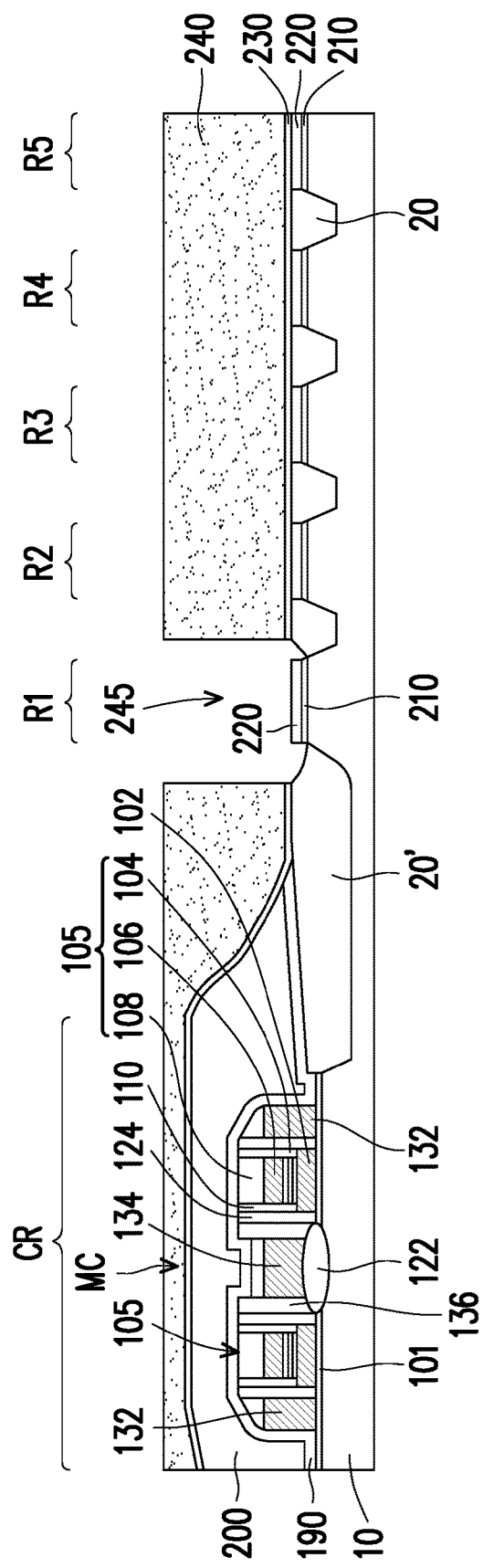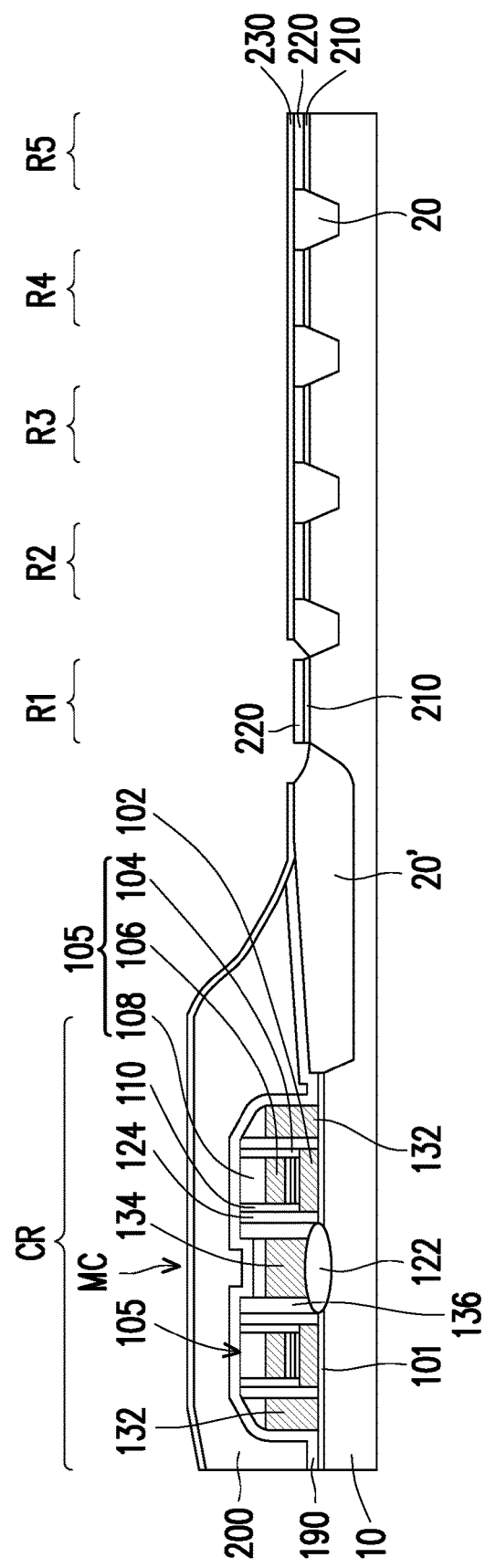

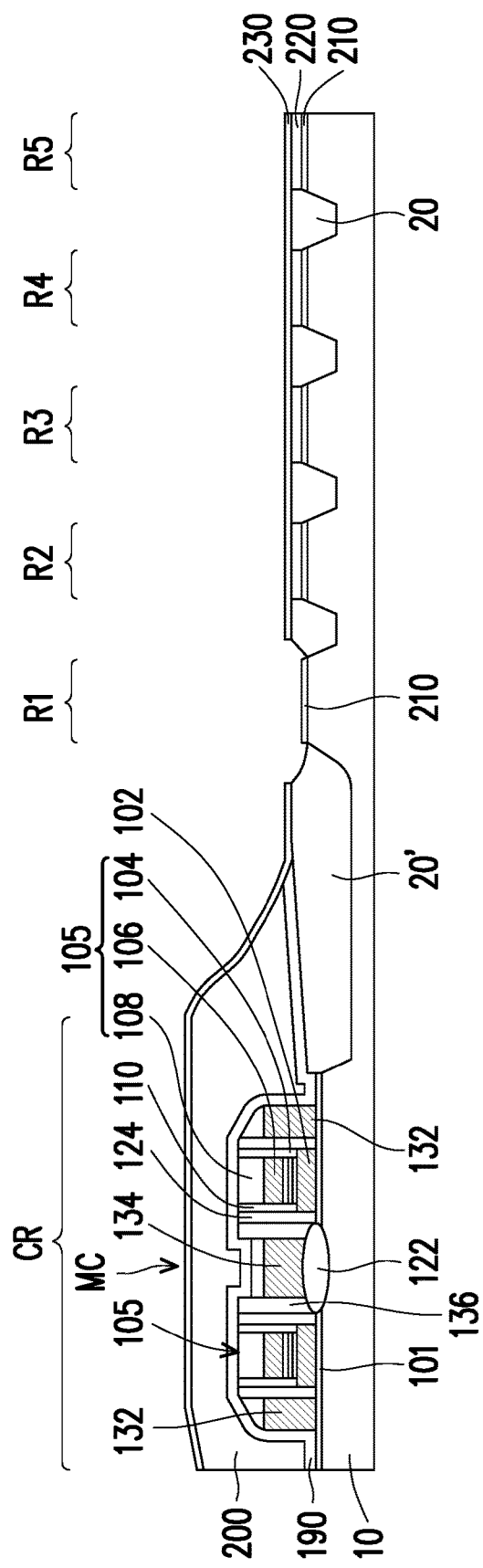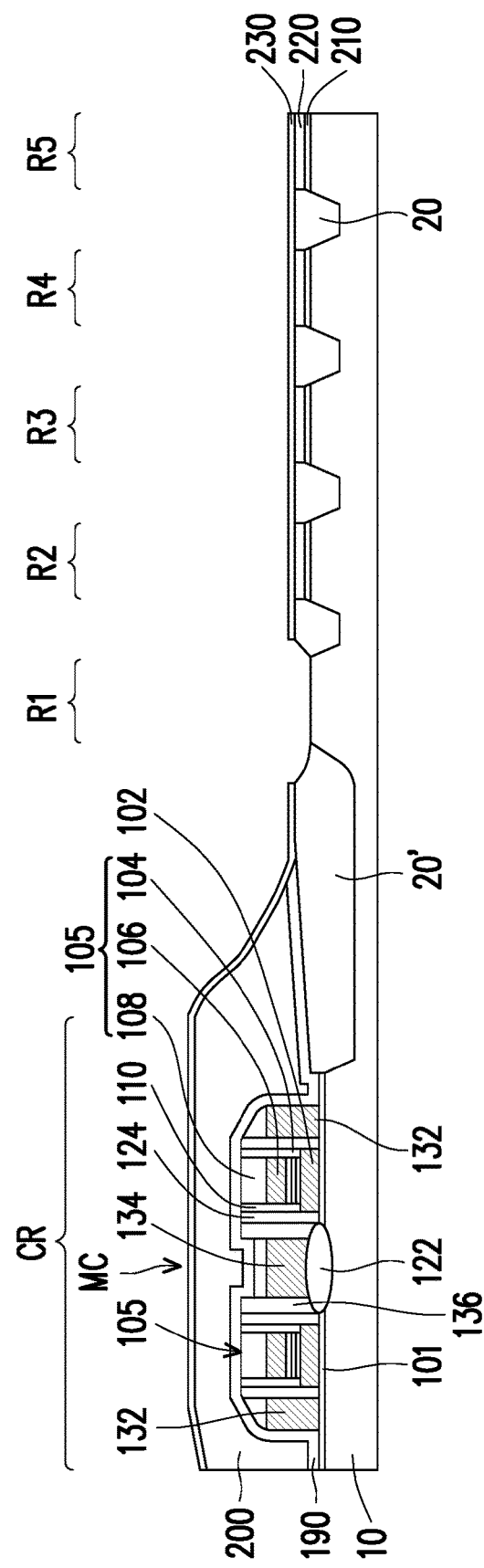

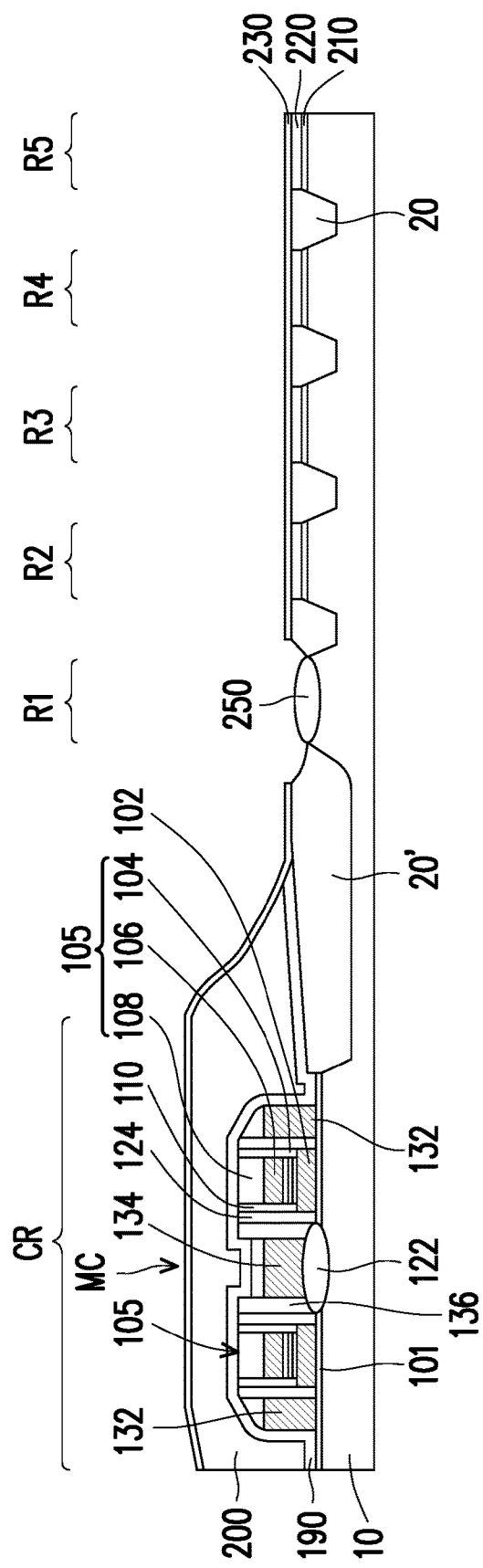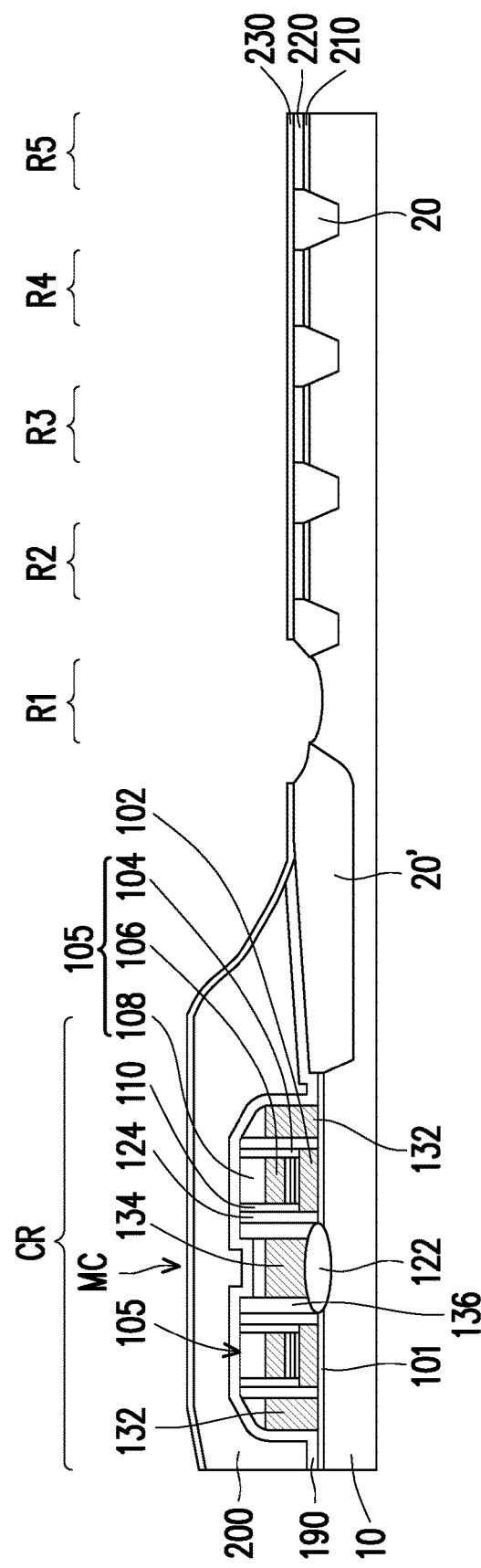

SEMICONDUCTOR DEVICE WITH FIELD EFFECT TRANSISTORS OF DIFFERING GATE DIELECTRIC THICKNESS ON THE SAME SUBSTRATE AND METHOD OF MANUFACTURING THE SAME

CROSS-REFERENCE TO RELATED APPLICATION

This application claims the priority benefit of U.S. provisional application Ser. No. 62/712,223, filed on Jul. 31, 2018. The entirety of the above-mentioned patent application is hereby incorporated by reference herein and made a part of this specification.

BACKGROUND

As the semiconductor industry has progressed into nanometer technology process nodes in pursuit of higher device density, higher performance, and lower costs, there have been challenges in combining the high-voltage (HV) device and High-k metal gate (HKMG) Complementary metal oxide semiconductor (CMOS) technology. For example, the planarizing process, such as chemical mechanical polishing (CMP) process, should be improved for metal loss issue.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIG. 2A to FIG. 2D are cross sectional views illustrating various stages of a sequential manufacturing process for forming a step between a memory cell region and circuit regions according to a second embodiment of the disclosure.

FIG. 3A to FIG. 3J are cross sectional views illustrating various stages of a sequential process for manufacturing a semiconductor device including a memory cell region and circuit regions according to a third embodiment of the disclosure.

DETAILED DESCRIPTION

Figure 1:
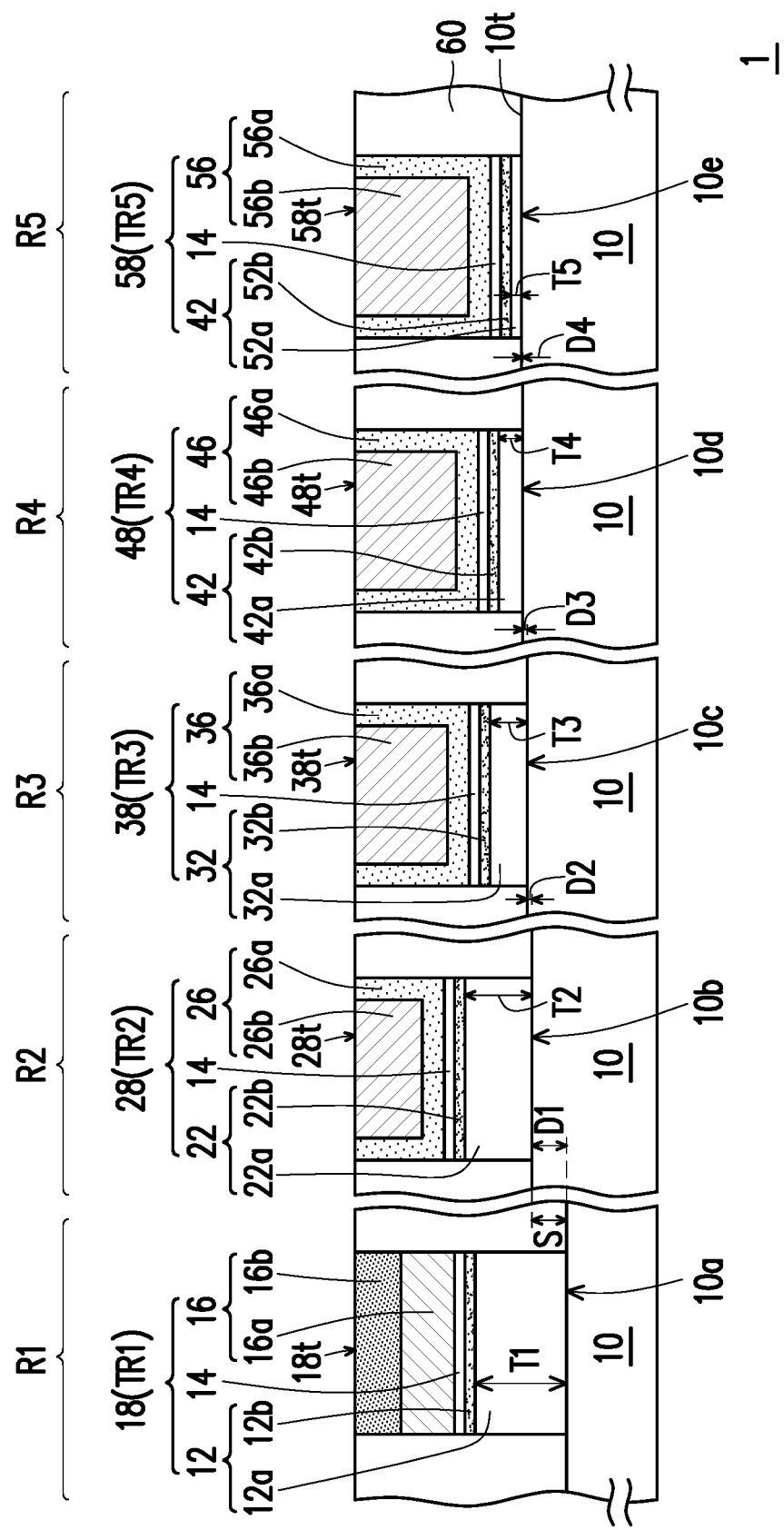
FIG. 1 is a cross sectional view of a semiconductor device including circuit regions with various operation voltages according to a first embodiment of the disclosure.

It is to be understood that the following disclosure provides many different embodiments, or examples, for implementing different features of the invention. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly. In addition, the term "made of" may mean either "comprising" or "consisting of." In the present disclosure, a phrase "one of A, B and C" means "A, B and/or C" (A, B, C, A and B, A and C, B and C, or A, B and C), and does not mean one element from A, one element from B and one element from C, unless otherwise described.

The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

In some embodiments, a semiconductor device includes memory cells (e.g., non-volatile memory devices) and peripheral circuits (e.g., drivers, decoders, I/O circuits and/or logic circuits). The memory cells generally require a stacked structure in which plural layers, such as polysilicon layers, are stacked, while the peripheral circuits generally include field effect transistors (FETs) having a height smaller than the memory cells. Because of the structure differences, when, for example, a conductive material layer for a gate structure and/or an interlayer dielectric (ILD) layer are formed over the memory cells and the peripheral circuits, there is a height difference in the ILD layer between a memory cell region and a peripheral circuit region. Such a height difference may affect the performance of CMP on the conductive material layer and/or the ILD layer.

In addition, the peripheral circuits include various FETs operating at different voltages. For example, the peripheral circuits include a high-voltage (HV) circuit (or FET) operating at, for example, 5 V or more. Such a HV circuit generally requires a thick gate dielectric layer, while other circuits may require a thinner gate dielectric layer. Such a thickness differences in the gate dielectric layers will affect the performance of CMP. Moreover, the thickness differences in the gate dielectric layers also result in metal (i.e.

polysilicon) loss issue in the HV device when integrating the HV device with HKMG CMOS technology and further affect the NMOS and/or PMOS performance.

FIG. 1 is a cross sectional view of a semiconductor device including circuit regions with various operation voltages according to a first embodiment of the disclosure.

Referring to FIG. 1, the semiconductor device 1 of the first embodiment includes a first field effect transistor (FET) TR1, a second FET TR2, a third FET TR3, a fourth FET TR4, and a fifth FET TR5 on a substrate 10 in the first to fifth circuit regions R1-R5, respectively. The first to fifth FETs TR1-TR5 may be a PMOS or an NMOS, respectively. The FET illustrated in each region R1-R5 may be a planar FET or FinFET, for example. Although FIG. 1 illustrates only one FET in each region R1-R5, each region includes more than one FET constituting circuitry.

In some embodiments, the substrate 10 may be made of silicon or other semiconductor materials. For example, the substrate 10 may be a silicon bulk wafer. Alternatively, or additionally, the substrate 10 may include other elementary semiconductor materials such as germanium. In some embodiments, the substrate 10 is made of a compound semiconductor such as silicon carbide, gallium arsenic, indium arsenide or indium phosphide. In some embodiments, the substrate 10 is made of an alloy semiconductor such as silicon germanium, silicon germanium carbide, gallium arsenic phosphide, or gallium indium phosphide. Furthermore, the substrate 10 may be a semiconductor on insulator such as silicon on insulator (SOI) or silicon on sapphire.

In detail, the substrate 10 includes first to fifth circuit regions R1-R5. In some embodiments, each region is isolated by isolation structure (not shown), such as shallow trench isolation (STI) and/or well region, from the adjacent region.

As shown in FIG. 1, the first circuit includes a first field effect transistor (FET) TR1 having a first gate structure 18 that is formed on the substrate 10 in the first circuit region R1. In some embodiments, the first gate structure 18 include a first gate dielectric layer 12 and a first gate electrode 16 over the first gate dielectric layer 12. In an embodiment, the first gate dielectric layer 12 includes silicon oxide, silicon nitride, silicon oxynitride, a high-k dielectric material, the like, or a combination thereof, and is formed by a chemical vapor deposition (CVD) process, ALD, a thermal oxidation process, or the like. In FIG. 1, the first gate dielectric layer 12 may include a bottom portion 12a and a top portion 12b over the bottom portion 12a. In some embodiments, the bottom portion 12a and the top portion 12b have different dielectric materials with different dielectric constants. In some alternative embodiments, a dielectric constant of the top portion 12b is higher than a dielectric constant of the bottom portion 12a. For example, the bottom portion 12a include silicon oxide, and the top portion 12b includes a high-k dielectric material that has dielectric constant greater than silicon oxide or greater than 4. The high-k dielectric material includes oxides and/or silicates of Hf, Al, Zr, La, Mg, Ba, Ti, and other metals, silicon nitride, silicon oxide, and the like, or combinations thereof. The high-k dielectric material includes hafnium oxide (HfO), hafnium silicon oxide (HfSiO), hafnium aluminum oxide (HfAlO), or hafnium tantalum oxide (HfTaO), for example. However, the disclosure is not limited thereto. In other embodiments, the first gate dielectric layer 12 may be a composite stack structure with layers having different dielectric constants. The bottom portion 12a and the top portion 12b may have same shape or different shapes. The bottom portion 12a and the top portion 12b may have an inverted I-shape cross section or U-shape cross section, for example.

As shown in FIG. 1, the first gate electrode 16 is formed over the first gate dielectric layer 12. The first gate electrode 16 may include a lower portion 16a and an upper portion 16b over the lower portion 16a. In some embodiments, the lower portion 16a may include polysilicon such as undoped polysilicon, a doped polysilicon, or a combination thereof, and is formed by a CVD process or any suitable deposition process. The lower portion 16a may be made of N-type doped polysilicon for an N-type FET, or made of P-type doped polysilicon for a P-type FET. In some embodiments, the upper portion 16b has a metal silicide (e.g., CoSi, NiSi, or the like) and is formed by a self-align silicidation (salicidation) process or a suitable deposition process, such as a CVD process.

As shown in FIG. 1, in some embodiments, the first gate structure 18 may further includes a barrier layer (or referred to as a buffer layer) 14 between the first gate dielectric layer 12 and the first gate electrode 16. In some embodiments, the barrier layer 14 includes TiN, TaN, TaC, the like, or a combination thereof, and is formed by a CVD process, a physical vapor deposition (PVD) process, ALD process, or any suitable deposition process. In alternative embodiments, the barrier layer 14 may help eliminate a Fermi level pinning (FLP) between the first gate dielectric layer 12 (e.g., the high-k dielectric material) and the first gate electrode 16 (e.g., polysilicon).

It should be noted that in the first circuit region R1, surface 10a of the substrate 10, which the first gate dielectric layer 12 is formed thereon, is lower than a topmost surface 10t of the substrate 10. In some embodiments, the surface 10a of the substrate 10 in the first circuit region R1 is lower than surfaces 10b to 10e in the second to fifth circuit regions R2 to R5. The first gate dielectric layer 12 is able to be thick enough for the HV device, which operates at the highest voltage V1 among the circuits in the first to fifth circuit regions R1-R5. In some embodiments, the operational voltage for the HV device more than about 5 V (absolute value) and may be the highest in the semiconductor device 1. In certain embodiments, the operational voltage for the HV device is in a range from about 7 V to 15 V (absolute value). A thickness T1 of the first gate dielectric layer 12 of the first FET TR1 in the first circuit region R1 is largest among those of the first FET TR1 to fifth FET TR5.

As shown in FIG. 1, the second circuit includes a second FET TR2 having a second gate structure 28 that is formed on the substrate 10 in the second circuit region R2. In some embodiments, the second gate structure 28 include a second gate dielectric layer 22 and a second gate electrode 26 over the second gate dielectric layer 22. The second gate dielectric layer 22 may include a bottom portion 22a and a top portion 22b over the bottom portion 22a. The material and forming method of the second gate dielectric layer 22 are similar to the material and forming method of the first gate dielectric layer 12 illustrated in above embodiments. Thus, details thereof are omitted here.

In some embodiments, the second gate electrode 26 is formed over the second gate dielectric layer 22. The second gate electrode 26 may include a metal-containing conductive layer. The metal-containing conductive layers includes a barrier, a work function layer, a seed layer, an adhesion layer, a barrier layer, a filter layer, a metal filling layer or a combination thereof. The metal-containing conductive layers include Al, Cu, W, Ti, Ta, Ag, Ru, Mn, Zr, TiAl, TiN, TaN, WN, TiAlN, TaC, TaCN, TaSiN, TiSiN, NiSi, CoSi, or a combination thereof, for example. The metal-containing conductive layer is formed by forming metal-containing conductive material, and a chemical mechanical polishing (CMP) process, an etching process, or other suitable processes.

In some embodiments, the second gate electrode 26 may include a first conductive layer (or referred to as a lower portion) 26a and a second conductive layer (or referred to as an upper portion) 26b over the lower portion 26a. In FIG. 1, the lower portion 26a has a U-shape cross section. The upper portion 26b is formed over the lower portion 26a and surrounded by the lower portion 26a. In some embodiments, the lower portion 26a may include a work function material, such as a P-type work function material and/or a N-type work function material. The P-type work function material may include TiN, TaN, Ru, Mo, Al, WN, $ZrSi_2$, $MoSi_2$, $TaSi_2$, $NiSi_2$, any suitable P-type work function material, or a combination thereof. The N-type work function material may include Ti, Ag, TaAl, TaAlC, TiAlN, TaC, TaCN, TaSiN, Mn, Zr, any suitable N-type work function material, or a combination thereof. The lower portion 26a is formed by a CVD process, a plasma-enhanced chemical vapor deposition (PECVD) process, an atomic layer deposition (ALD) process, or any suitable process. The upper portion 26b may include a metal filling layer and is formed by a CVD process, a PVD process, the like, or any suitable process. The metal filling layer may include Al, W, Cu and/or any suitable material. In addition, the second gate structure 28 further includes the barrier layer 14 between the second gate dielectric layer 22 and the second gate electrode 26.

In some embodiments, the second FET TR2 is used for an analog circuit, which operates at the second highest voltage V2 (V1>V2) among the circuits in the first to fifth circuit regions R1-R5. In some embodiments, the operational voltage for the analog circuit is about 3 V. In FIG. 1, the first gate dielectric layer 12 is formed on the surface 10a of the substrate 10 in the first circuit region R1, while the second gate dielectric layer 22 is formed on the surface 10b of the substrate 10 in the second circuit region R2. The surface 10a of the substrate 10 in the first circuit region R1 is lower than the surface 10b of the substrate 10 in the second circuit region R2, and thus the thickness T1 of the bottom portion 12a of the first gate dielectric layer 12 in the first circuit region R1 is able to be greater than the thickness T2 of the bottom portion 22a of the second gate dielectric layer 22 in the second circuit region R2 and a top surface 18t of the first gate structure 18 may be coplanar with a top surface 28t of the second gate structure 28 without sacrificing the thickness of the first gate electrode 16.

As shown in FIG. 1, the third circuit includes a third FET TR3 having a third gate structure 38 that is formed on the substrate 10 in the third circuit region R3. In some embodiments, the third gate structure 38 include a third gate dielectric layer 32 and a third gate electrode 36 over the third gate dielectric layer 32. The third gate dielectric layer 32 may include a bottom portion 32a and a top portion 32b over the bottom portion 32a. In some embodiments, the third gate electrode 36 is formed over the third gate dielectric layer 32. The third gate electrode 36 may include a lower portion 36a and an upper portion 36b over the lower portion 36a. In addition, the third gate structure 38 further includes the barrier layer 14 between the third gate dielectric layer 32 and the third gate electrode 36. The material and forming method of the third gate dielectric layer 32 and the third gate electrode 36 are similar to the material and forming method of the second gate dielectric layer 22 and the second gate electrode 26 illustrated in above embodiments. Thus, details thereof are omitted here.

In some embodiments, the third FET TR3 is used for an I/O circuit, which operates at the third highest voltage V3 (V1>V2>V3) among the circuits in the first to fifth circuit regions R1-R5. In some embodiments, the operational voltage for the I/O circuit is equal to or more than about 1.5 V and less than 3.5 V. In FIG. 1, the surface 10c of the substrate 10 in the third circuit region R3, which the third gate dielectric layer 32 is formed thereon is higher than the surface 10a of the substrate 10 in the first circuit region R1. In some embodiments, the surface 10c of the substrate 10 in the third circuit region R3 is coplanar with the surface 10b of the substrate 10 in the second circuit region R2. However, the disclosure is not limited thereto. In other embodiments, the surface 10c of the substrate 10 in the third circuit region R3 is higher than the surface 10b of the substrate 10 in the second circuit region R2. In some embodiments, the thickness T3 of the bottom portion 32a of the third gate dielectric layer 32 in the third circuit region R3 is third largest. That is, the thickness T1>the thickness T2>the thickness T3.

As shown in FIG. 1, the fourth circuit includes a fourth FET TR4 having a fourth gate structure 48 that is formed on the substrate 10 in the fourth circuit region R4. In some embodiments, the fourth gate structure 48 include a fourth gate dielectric layer 42 and a fourth gate electrode 46 over the fourth gate dielectric layer 42. The fourth gate dielectric layer 42 may include a bottom portion 42a and a top portion 42b over the bottom portion 42a. In some embodiments, the fourth gate electrode 46 is formed over the fourth gate dielectric layer 42. The fourth gate electrode 46 may include a lower portion 46a and an upper portion 46b over the lower portion 46a. In addition, the fourth gate structure 48 further includes the barrier layer 14 between the fourth gate dielectric layer 42 and the fourth gate electrode 46. The material and forming method of the fourth gate dielectric layer 42 and the fourth gate electrode 46 are similar to the material and forming method of the second gate dielectric layer 22 and the second gate electrode 26 illustrated in above embodiments. Thus, details thereof are omitted here.

In some embodiments, the fourth FET TR4 is used for a word line (WL) driver circuit, which operates at the fourth highest voltage V4 (V1>V2>V3>V4) among the circuits in the first to fifth circuit regions R1-R5. In some embodiments, the operational voltage for the WL driver circuit is equal to or more than about 0.8 V and less than 2.5 V. In FIG. 1, the surface 10d of the substrate 10 in the fourth circuit region R4, which the fourth gate dielectric layer 42 is formed thereon, is higher than the surface 10a of the substrate 10 in the first circuit region R1. The surface 10d of the substrate 10 in the fourth circuit region R4 is coplanar with the surface 10c of the substrate 10 in the third circuit region R3, in some embodiments. However, the disclosure is not limited thereto. In other embodiments, the surface 10d of the substrate 10 in the fourth circuit region R4 is higher than the surface 10c of the substrate 10 in the third circuit region R3. In some embodiments, the thickness T4 of the bottom portion 42a of the fourth gate dielectric layer 42 in the fourth circuit region R4 is fourth largest. That is, the thickness T1>the thickness T2>the thickness T3>the thickness T4.

As shown in FIG. 1, the fifth circuit includes a fifth FET TR5 having a fifth gate structure 58 that is formed on the substrate 10 in the fifth circuit region R5. In some embodiments, the fifth gate structure 58 include a fifth gate dielectric layer 52 and a fifth gate electrode 56 over the fifth gate dielectric layer 52. The fifth gate dielectric layer 52 may include a bottom portion 52a and a top portion 52b over the bottom portion 52a. In some embodiments, the fifth gate electrode 56 is formed on the fifth gate dielectric layer 52. The fifth gate electrode 56 may include a lower portion 56a and an upper portion 56b over the lower portion 56a. In addition, the fifth gate structure 58 further includes the barrier layer 14 between the fifth gate dielectric layer 52 and the fifth gate electrode 56. The material and forming method of the fifth gate dielectric layer 52 and the fifth gate electrode 56 are similar to the material and forming method of the second gate dielectric layer 22 and the second gate electrode 26 illustrated in above embodiments. Thus, details thereof are omitted here.

In some embodiments, the fifth FET TR5 is used for a core logic circuit, which operates at the lowest voltage V5 (V1>V2>V3>V4>V5) among the circuits in the first to fifth circuit regions R1-R5. In some embodiments, the operational voltage for the core logic circuit is equal to or more than about 0.5 V and less than 1.5 V. In FIG. 1, surface 10e of the substrate 10 in the fifth circuit region R5, which the fifth gate dielectric layer 52 is formed thereon, is higher than the surface 10a of the substrate 10 in the first circuit region R1. The surface 10e of the substrate 10 in the fifth circuit region R5 is coplanar with the surface 10d of the substrate 10 in the fourth circuit region R4, in some embodiments. However, the disclosure is not limited thereto. In other some embodiments, the surface 10e of the substrate 10 in the fifth circuit region R5 is higher than the surface 10d of the substrate 10 in the fourth circuit region R4. In some embodiments, the thickness T5 of the bottom portion 52a of the fifth gate dielectric layer 52 in the fifth circuit region R5 is smallest (T1>T2>T3>T4>T5). In some embodiments, the top portions 12b, 22b, 32b, 42b, and 52b have the same thickness.

In other embodiments, the voltage V1 is equal to the voltage V2, the voltage V2 is equal to the voltage V3, the voltage V3 is equal to the voltage V4 and/or the voltage V4 is equal to the voltage V5 (but not more than two voltages are equal to each other) and/or the thickness T1 is equal to the thickness T2, the thickness T2 is equal to the thickness T3, the thickness T3 is equal to the thickness T4 and/or the thickness T4 is equal to the thickness T5 (but not more than two thicknesses are equal to each other).

As shown in FIG. 1, the upper surface 10a of the substrate 10 in the first circuit region R1 is lower than the upper surface 10b of the substrate 10 in the second circuit region R2 by a distance D1. The upper surface 10a of the substrate 10 in the first circuit region R1 is in direct contact with the first gate dielectric layer 12, and the upper surface 10b of the substrate 10 in the second circuit region R2 is in direct contact with the second gate dielectric layer 22. In other words, a step S is formed between the first circuit region R1 and the second circuit region R2. In some embodiments, the distance D1 is referred to as a step height. Because of these "steps" between the first circuit region R1 and the second circuit region R2, it is possible to reduce height differences caused by the different stacked structure and/or gate dielectric thicknesses.

In other embodiments, a distance (or referred to as a step height) D2 is included between the surface 10b of the substrate 10 in the second circuit region R2 and the upper surface 10c of the substrate 10 in the third circuit region R3, a distance (or referred to as a step height) D3 is included between the upper surface 10c of the substrate 10 in the third circuit region R3 and the upper surface 10d of the substrate 10 in the fourth circuit region R4, and a distance (or referred to as a step height) D4 is included between the upper surface 10d of the substrate 10 in the fourth circuit region R4 and the upper surface 10e of the substrate 10 in the fifth circuit region R5. In some embodiments, the distance D1 is larger than the distances D2, D3, D4 and D5. In other some embodiments, the distance D1 is the same as or greater than a difference between the first thickness T1 and the second thickness T2.

In some embodiments, the distance D1 is in a range from about 10 nm to about 35 nm. The step difference D2 is in a range from about 1 nm to about 3 nm, in some alternative embodiments. The step difference D3 is in a range from about 1 nm to about 2 nm, in other embodiments. The step difference D4 is in a range from about 0.5 nm to about 2 nm, in other embodiments.

The top surface of the top portion 22b is the highest among the top portion 12b, 22b, 32b, 42b and 52b. The heights of the top surface of the top portion 22b to top portion 52b gradually decreases, for example. In some embodiments, the top surface of the top portion 12b of the first gate dielectric layer 12 is lower than the top surface of the top portion 22b of the second gate dielectric layer 22. In other some embodiments, the top surface of the top portion 12b of the first gate dielectric layer 12 and the top surface of the top portion 22b of the second gate dielectric layer 22 have the same height.

In some embodiments, the first FET TR1 to the fifth FET TR5 may further include spacers (not shown) on the sidewalls of the first gate structure 18 to the fifth gate structure 58. The spacers may include silicon oxide, silicon nitride, silicon oxynitride, the like or a combination thereof, and is formed by depositing a spacer material to cover the first gate structure 18 to the fifth gate structure 58, and then performing an etching process such as an anisotropic process on the spacer material to expose the surface of the substrate 10. The remaining spacer material forms the spacers.

The first FET TR1 to the fifth FET TR5 may further include lightly doped source/drain (LDD) regions (not shown) and source/drain regions (not shown) in the substrate 10 in the first to fifth circuit regions R1-R5, respectively. The lightly doped source/drain (LDD) regions and the source/drain regions may be N-type doped regions for N-type FETs or P-type doped regions for P-type FETs.

As shown in FIG. 1, after forming the FETs TR1-TR5, a dielectric layer 60 is formed over the substrate 10 to surround the FETs TR1-TR5. In some embodiments, the dielectric layer 60 is referred as to an interlayer dielectric (ILD) layer. The dielectric layer 60 may include silicon oxide, silicon nitride, silicon oxynitride, the like or a combination thereof formed by any suitable method, e.g., CVD, ALD, and the like. The dielectric layer 60 may is formed by depositing a dielectric material to cover the FETs TR1-TR5, and then planarizing the dielectric material to expose the top surface 18t (and/or 28t, 38t, 48t, 58t) of the gate structure 18 (and/or 28, 38, 48, 58). In the case, after the planarization, the top surfaces 18t, 28t, 38t, 48t, 58t of the gate structures 18, 28, 38, 48, 58 are at a same level with a top surface 60t of the dielectric layer 60.

In some embodiments, before the dielectric layer 60 is formed, an etch stop layer (or referred to as a contact etching stop layer, CESL, not shown) is formed over the substrate 10 to cover the FETs TR1-TR5. The etch stop layer and the dielectric layer 60 may have different materials. The etch stop layer may include silicon oxide, silicon nitride, silicon oxynitride, the like or a combination thereof formed by any suitable method, e.g., CVD, ALD, and the like.

It should be noted that the first FET TR1 in the first circuit region R1 (i.e., High-voltage (HV) region) has a thick gate dielectric layer on the substrate 100 in the HV region R1, the surface 10a of the substrate 10 in the HV region R1 is recessed relative to the surfaces 10b-10e in the second circuit region R2 to the fifth circuit region R5, which may reduce the height difference caused by the thick gate dielectric layer 12 and improve the performance of the following planarization process. In addition, the recessed surface 10a of the substrate 10 in the HV region R1 is able to decrease the metal (i.e. polysilicon) loss issue resulting from the thickness differences between the gate dielectric layers 12, 22, 32, 42, 52 in the first to fifth circuit regions R1-R5. The thickness of the first gate electrode 16 may be greater than or equal to the thickness of the second gate electrode 26, for example. The first gate electrode 16 has sufficient thickness to include the lower portion 16a made of polysilicon and the upper portion 16b made of metal silicide instead of fully metal silicide gate electrode. Therefore, the first gate electrode 16 is able to be doped by N-type dopants for NMOS FET and/or P-type dopants for PMOS FET. In other words, the embedded gate structure in the substrate in the HV region is compatible with the HKMG CMOS technology and improves the NMOS and/or PMOS performance.

Figure 6:
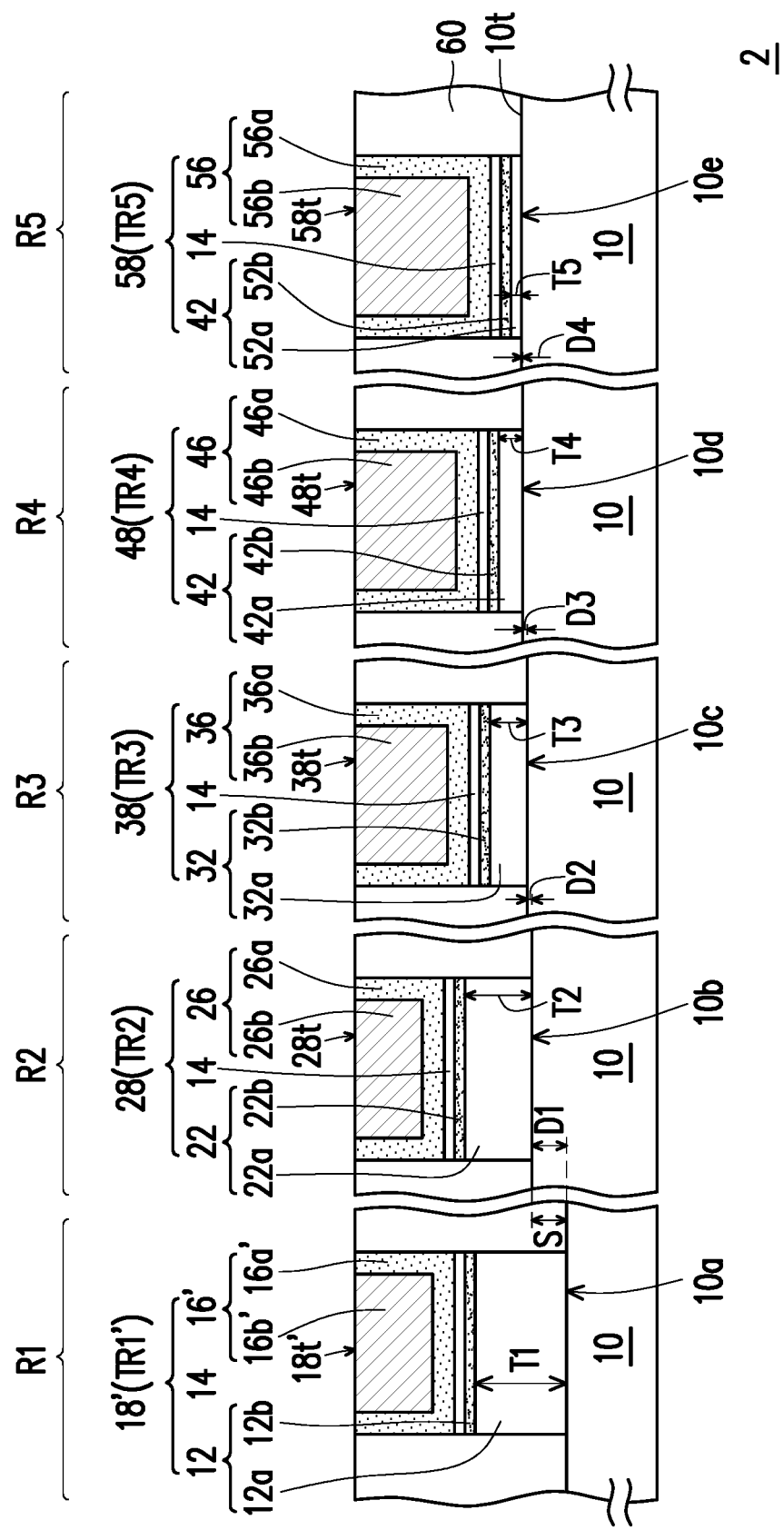
FIG. 6 is a cross sectional view of a semiconductor device including circuit regions with various operation voltages according to another embodiment of the disclosure.

Further, in another embodiment, the first gate electrode may be made of metal gate. In detail, as shown in FIG. 6, the arrangement and material of a semiconductor device 2 are similar to the arrangement and material of a semiconductor device 1 and has been described in detail in the above embodiments. Thus, details thereof are omitted here. A difference therebetween lies in that the semiconductor device 2 includes a first FET TR1' in the first circuit region R1. The first FET TR1' may have a first gate structure 18' with a first gate electrode 16' different from the first gate electrode 16 illustrated in FIG. 1. As shown in FIG. 6, the first gate electrode 16' may include a lower portion 16a' and an upper portion 16b' over the lower portion 16a'. In some embodiments, the lower portion 16a' has a U-shape cross section. The upper portion 16b' is formed over the lower portion 16a' and surrounded by the lower portion 16a'. In some alternative embodiments, the lower portion 16a' and the lower portion 26a have the same material including a work function material. The upper portion 16b' and the upper portion 26b may have the same material including a metal filling layer. The work function material and the metal filling layer have been described in detail in the above embodiments. Thus, details thereof are omitted here. Like the first FET TR1, the first FET TR1' has a thick gate dielectric layer on the substrate 100 in the HV region R1, the surface 10a of the substrate 10 in the HV region R1 is recessed relative to the surfaces 10b-10e in the second circuit region R2 to the fifth circuit region R5, which may reduce the height difference caused by the thick gate dielectric layer 12 and improve the performance of the following planarization process. That is, the top surfaces 18t', 28t, 38t, 48t, and 58t of the gate structures 18', 28, 38, 48, and 58 are at a same level with the top surface 60t of the dielectric layer 60 after the planarization.

FIG. 2A to FIG. 2D are cross sectional views illustrating various stages of a sequential manufacturing process for forming a step between a memory cell region and circuit regions according to a second embodiment of the disclosure. It is understood that additional operations may be provided before, during, and after processes shown by FIGS. 2A-2D, and some of the operations described below may be replaced or eliminated, for additional embodiments of the method. The order of the operations may be changed.

As shown in FIG. 2A, a mask layer 130 (e.g., a silicon nitride layer) is formed over a pad oxide layer 120 (e.g., a silicon oxide layer) formed on the substrate 10, and the mask layer 130 is patterned by using a photolithography process and an etching process such as an anisotropic process. In some embodiments, the pad oxide layer 120 is thermally grown silicon oxide, and the mask layer 130 is silicon nitride formed by chemical vapor deposition (CVD). In some embodiments, the thickness of the pad oxide layer 120 is in a range from about 5 nm to about 15 nm and the thickness of the mask layer 130 is in a range from about 50 nm to about 100 nm.

Then, as shown in FIG. 2B, a memory cell region CR is thermally oxidized by using wet oxidation, thereby forming an oxide layer 140 (so-called, "LOCOS"). The thickness of the oxide layer 140 is in a range from about 30 nm to about 100 nm.

As shown in FIG. 2C, the oxide layer 140 is removed by an etching process such as a wet etching process. In some embodiments, dilute hydrofluoric (dHF) acid may be used as an etchant of the wet etching process. Thereafter, the mask layer 130, the pad oxide layer 120 and the bird's beak portion are removed by an etching process such as wet etching processes to expose an etched surface TSF in the memory cell region CR. Thus, the step having a height D0 is formed between the memory cell region CR and circuit regions R1-R5. The step height D0 is defined by the difference between the original surface (i.e. the bottom surface of the pad oxide layer 120) SF and the etched surface TSF, as shown in FIGS. 2B-2D. The step height D0 is in a range from about 25 nm to about 50 nm, in some embodiments.

Figure 3A:
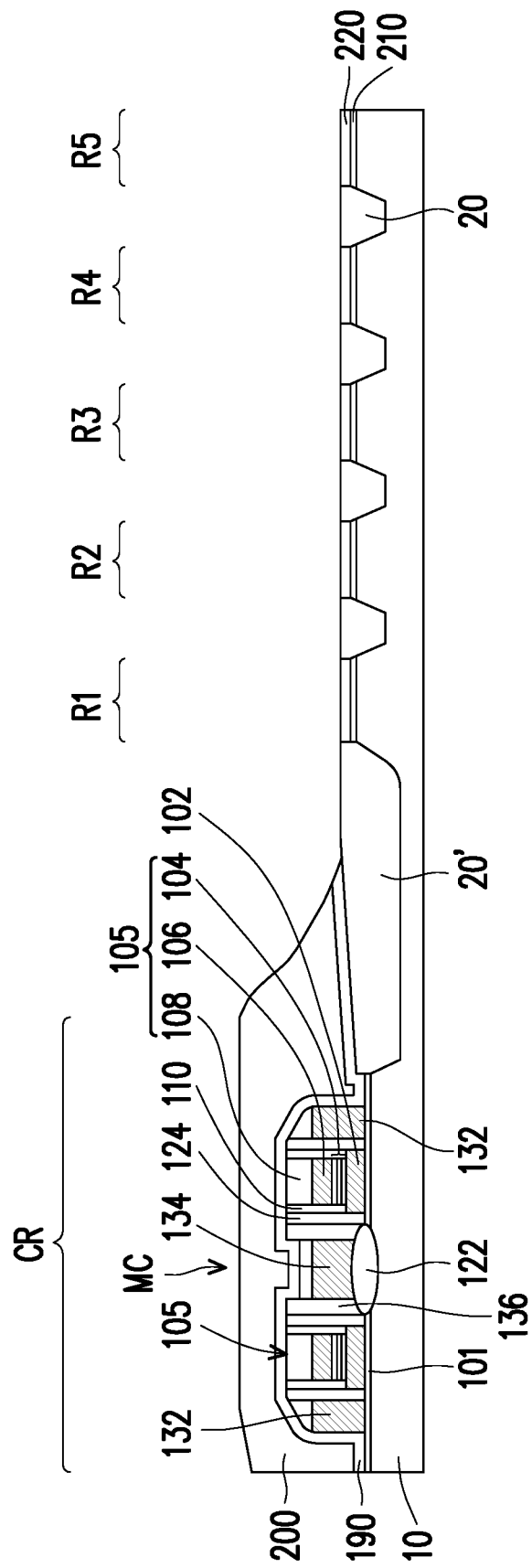

After the "step" is formed, isolation structures 20 (as shown in FIG. 3A) are formed. To form the isolation structures 20, another mask layer including a silicon oxide layer and a silicon nitride layer is formed on the substrate 10, and the mask layer is patterned by lithography and etching processes. Then, by using the patterned mask layer as an etching mask, the substrate 10 is etched to form trenches. A depth of the trenches is in a range from about 200 nm to about 300 nm, in some embodiments.

The trenches are filled with an insulating (or dielectric) material such as silicon oxide formed by CVD, and then, a planarization operation, such as CMP or an etch-back process, is performed so as to remove an upper part of the insulating material layer, thereby forming the isolation structures 20 and 20'. Portions of the substrate 10 not etched, and surrounded or separated by the isolation structures 20 is an active region, which transistors or other semiconductor devices are formed thereon. As shown in FIG. 3A, the memory cell region CR and the peripheral logic circuit regions R1-R5 are separated by a large isolation structure 20'. After the isolation structures 20 and 20' are formed, the memory cells MC are formed in the memory cell region CR.

FIG. 3A to FIG. 3J are cross sectional views illustrating various stages of a sequential process for manufacturing a semiconductor device including a memory cell region and circuit regions according to a third embodiment of the disclosure. It is understood that additional operations may be provided before, during, and after processes shown by FIGS. 3A-3J, and some of the operations described below may be replaced or eliminated, for additional embodiments of the method. The order of the operations may be changed.

After the step (as shown in FIGS. 2A-2D), a first oxide layer 210 is formed in the peripheral logic circuit regions R1-R5, and then a nitride layer 220 is formed on the first oxide layer 210, as shown in FIG. 3A. In some embodiments, the first oxide layer 210 is thermally grown silicon oxide, and the nitride layer 220 is silicon nitride or silicon oxynitride formed by a CVD process or a suitable process.

A plurality of memory cells MC are formed over the memory cell region CR. To fabricate the memory cell MC, a tunnel dielectric layer 101 is formed over the substrate 10 and the first polysilicon layer is formed over the tunnel dielectric layer 101. The first polysilicon layer is patterned by suitable patterning operations, thereby forming floating gate patterns (FG patterns) 102.

Figure 3B:
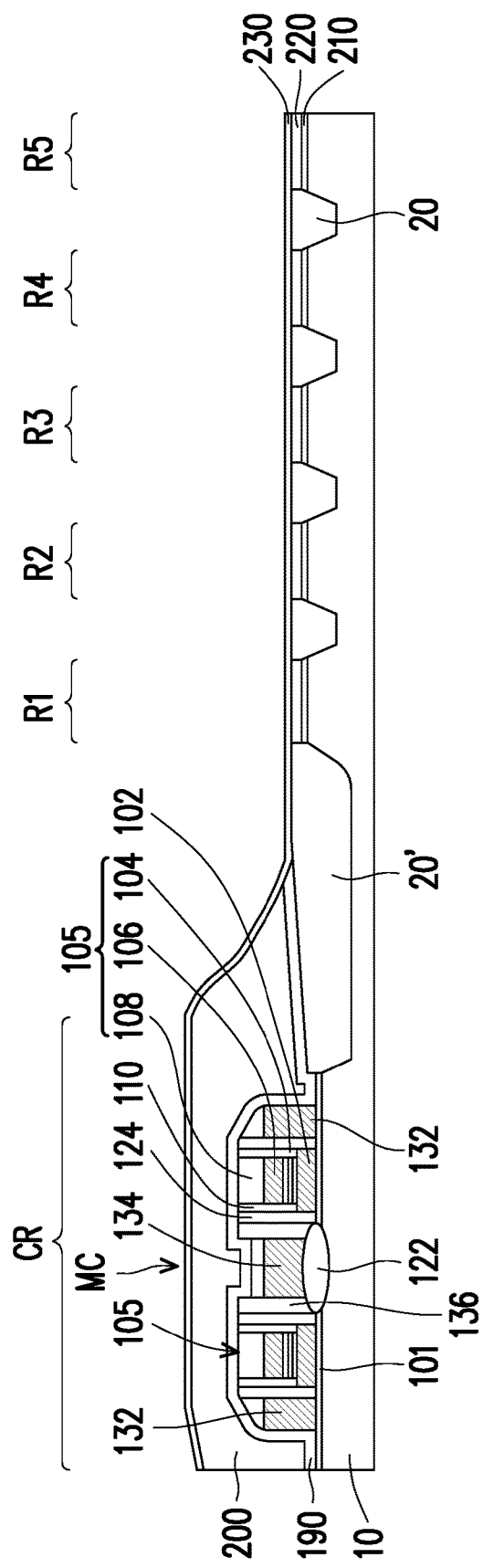

After the FG pattern 102 is formed, a stacked layer of a first insulating layer stack 104, a second polysilicon layer 106 and a second insulating layer 108 are formed over the FG pattern 102. The first insulating layer stack 104 includes one or more layers of a silicon oxide layer and a silicon nitride layer. In some embodiments, the second insulating layer 108 is silicon nitride. In certain embodiments, the second insulating layer 108 has a stacked structure of a silicon nitride layer, a silicon oxide layer, and a silicon nitride layer. These layers may be formed by a CVD process or an ALD process. Subsequently, the stacked layer is patterned by using lithography and etching operations, in some embodiments, thereby forming a gate stack structure 105 including the first insulating layer stack 104, a control gate (CG) 106 and the second insulating layer 108, as shown in FIG. 3B.

Further, first sidewall spacers (CG spacers) 110 are formed on both sidewalls of the gate stack structure 105, as shown in FIG. 3A. The first sidewall spacers 110 are made of, for example, one or more layers of silicon oxide (SiN), silicon oxide ($SiO_2$) and SiON, (silicon oxynitride) in some embodiments.

As shown in FIG. 3A, an erase gate oxide layer 122 is formed between two gate stack structures 105, and second sidewall spacers (FG spacers) 124 are formed aside the first sidewall spacers 110 and the FG pattern 102. In some embodiments, the second sidewall spacers 124 are made of, for example, one or more layers of SiN, $SiO_2$ and SiON, which may be the same or different from the first sidewall spacers 110.

Subsequently, word lines (or referred to as select gates SG) 132 are formed aside the two gate stack structures 105 and an erase gate (EG) 134 are formed between two gate stack structures 105 as shown in FIG. 3A. The word lines 132 and erase gate 134 are made of a conductive material, such as a doped polysilicon. Further, third sidewall spacers 136 are formed on sidewalls of the word lines 132, as shown in FIG. 3A.

After the memory cell MC is formed, one or more cover layers 200 is formed over the memory cell MC, as shown in FIG. 3A. In some embodiments, the cover layer 200 is made of polysilicon. Before forming the polysilicon cover layer 200, a dielectric layer 190, such as a silicon oxide layer, is formed over the memory cell MC by using a CVD process or a suitable process. The dielectric layer 190 and the cover layers 200 may be formed by deposition processes such as CVD or ALD and patterning process including photolithography process and an etching process sch as an anisotropic etching process.

Referring to FIG. 3B, a second oxide layer 230 is formed on the nitride layer 220. The second oxide layer 230 may include silicon oxide formed by CVD or ALD, in some embodiments. The second oxide layer 230 may be a resist protect oxide (RPO) layer, which may protect regions which should not be damaged by an etching or a removal process. In other embodiments, the second oxide layer 230 may be a bi-layer made of $SiO_x$ and $SiN_x$.

Figure 3C:
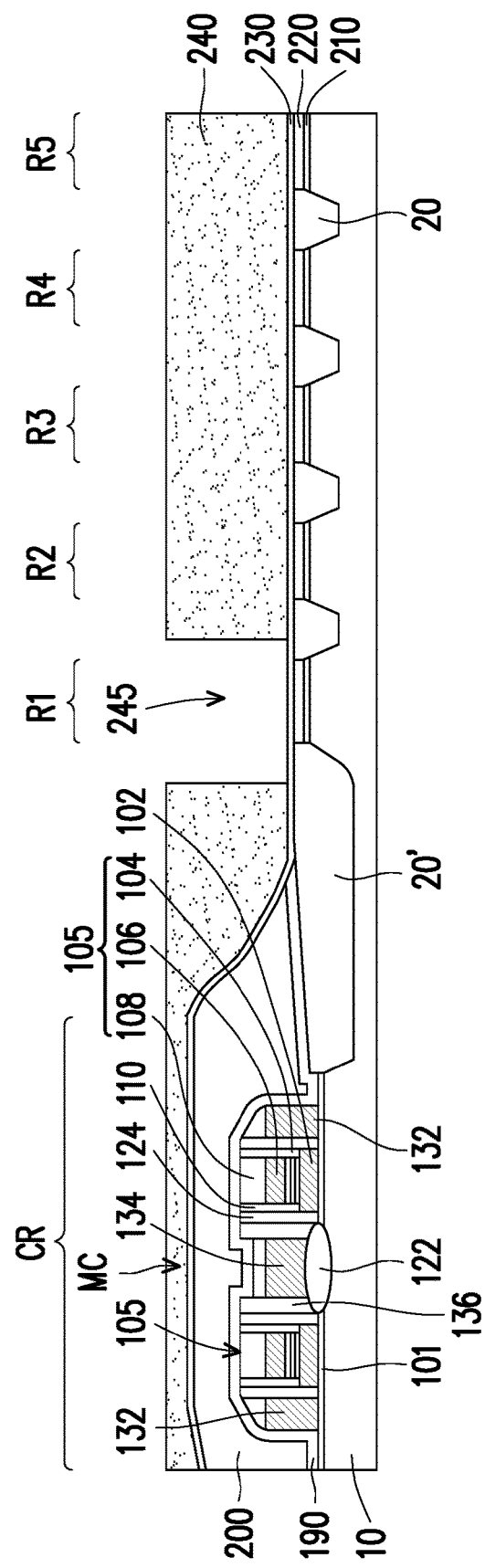

Referring to FIG. 3C, a mask pattern 240 such as a photoresist layer having an opening 245 is formed on the second oxide layer 230. In some embodiments, the opening 245 exposes the second oxide layer 230 in the first circuit region R1. The width of the opening 245 may larger than the width of the first circuit region R1. For example, the opening 245 exposes the second oxide layer 230 in the first circuit region R1 and portions of second oxide layer 230 on the isolation structures 20, 20' around the first circuit region R1. In other embodiments, the opening 245 exposes the second oxide layer 230 in the first and second circuit regions R1 and R2.

Referring to FIG. 3C and FIG. 3D, by using the mask pattern 240 as an etching mask, the second oxide layer 230 in the first circuit region R1 is removed by using an etching process. The etching process may be an isotropic process such as a wet etching process. In some embodiments, dilute hydrofluoric (dHF) acid may be used as an etchant of the wet etching process. By this etching, part of the isolation structures 20, 20' is also removed. Then, as shown in FIG. 3E, the mask pattern 240 is removed.

Referring to FIG. 3E and FIG. 3F, the exposed nitride layer 220 in first circuit region R1 is removed by using an etching process. The etching process may be an isotropic process such as a wet etching process. In some embodiments, $H_3PO_4$ may be used as an etchant of the wet etching process. Then, as shown in FIG. 3G, the exposed first oxide layer 210 in the circuit region R1 is removed by an etching process. The etching process may be an isotropic process such as a wet etching process. In some embodiments, dilute hydrofluoric (dHF) acid may be used as an etchant of the wet etching process.

Referring to FIG. 3H, a third oxide layer 250 is formed in the first circuit region R1. The third oxide layer 250 may be formed by a wet oxidation method. The third oxide layer 250 have a thickness of about 10 nm to about 50 nm, for example. Further, as shown in FIG. 3I, the third oxide layer 250 is removed by an etching process. The etching process may be an isotropic process such as a wet etching process. In some embodiments, dilute hydrofluoric (dHF) acid may be used as an etchant of the wet etching process. By this etching, the third oxide layer 250 may be fully removed or partially removed.

Figure 3J:
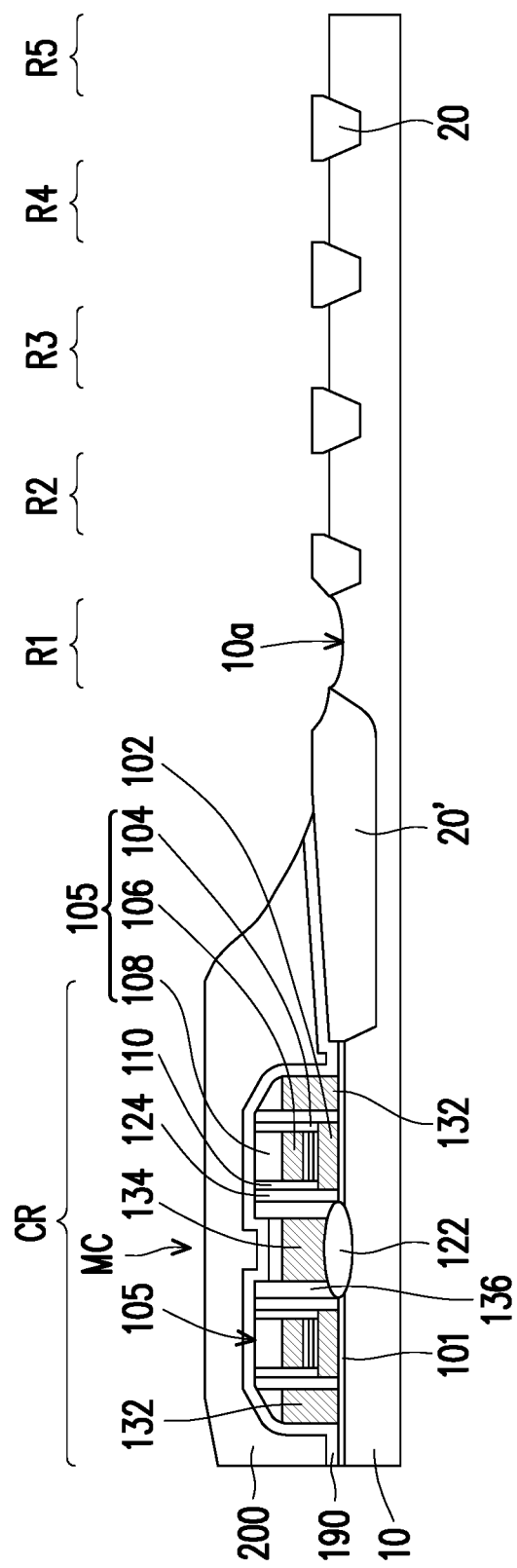

Referring to FIG. 3J, the second oxide layer 230, the silicon nitride layer 220, the first oxide layer 210 and any remaining third oxide layer 250, if exists, are removed by etching processes. The etching processes may be isotropic processes such as wet etching processes. As shown in FIG. 3J, the step between the first circuit region R1 and the second to fifth circuit regions R2-R5 is formed. In some embodiments, the first oxide layer 210 is not removed and remains on the substrate 10.

In other embodiments, the substrate 10 in the first circuit region R1 is directly etched by one or more dry and/or wet etching operations using a mask pattern formed to cover the memory cell region CR and the third oxide layer 250 to form the recessed surface 10a of the substrate 10.

In some embodiments, the top surface of the substrate 10 in the first circuit region R1 is higher than the top surface of the substrate 10 in the memory cell region CR. In other some embodiments, the top surface of the substrate 10 in the first circuit region R1 is at a same level as the top surface of the substrate 10 in the memory cell region CR.

Figure 4A:
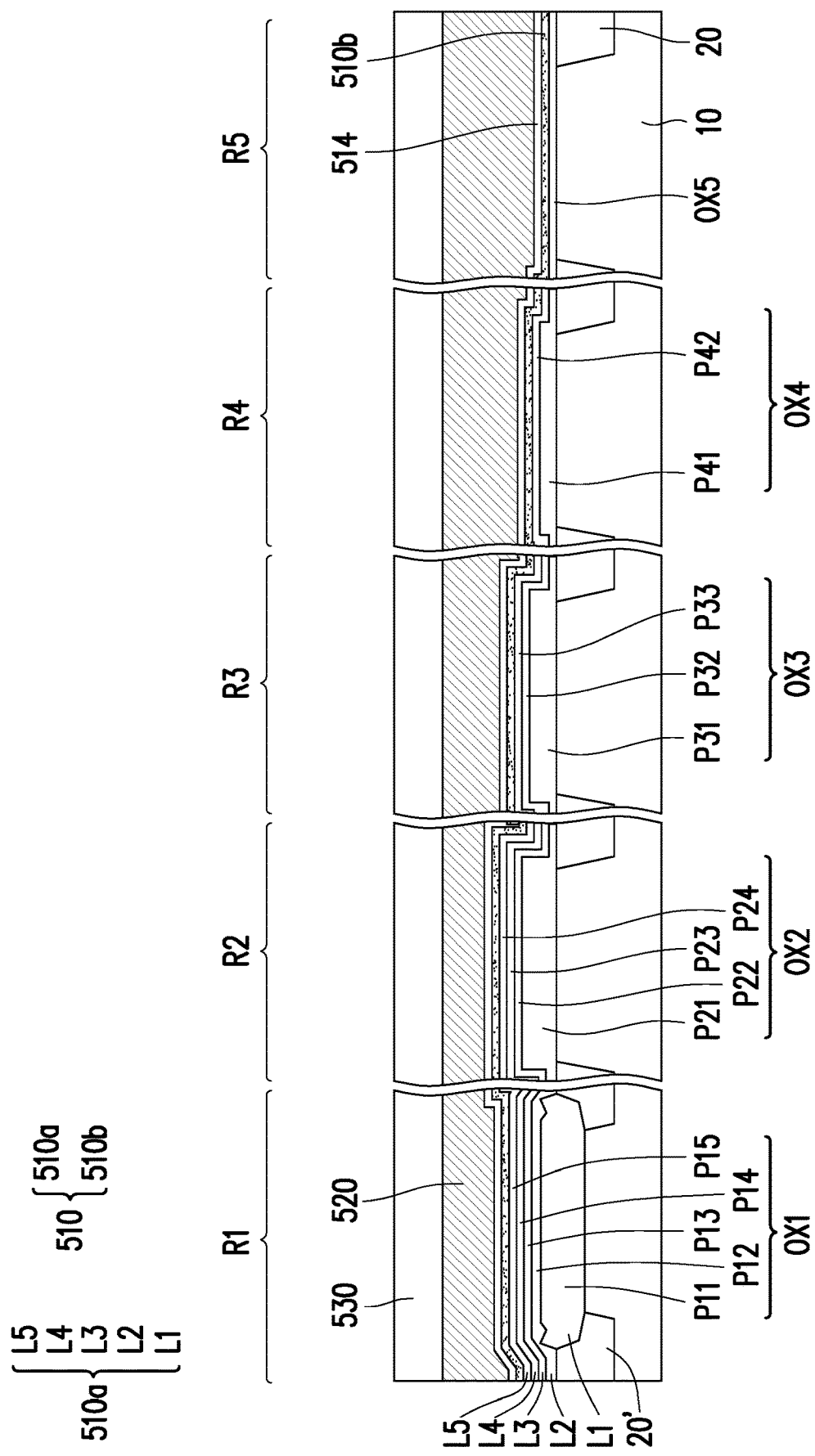
FIG. 4A to 4B are cross sectional views illustrating various stages of sequential processes for manufacturing a semiconductor device including the circuit regions according to a fourth embodiment of the disclosure.
Figure 4B:
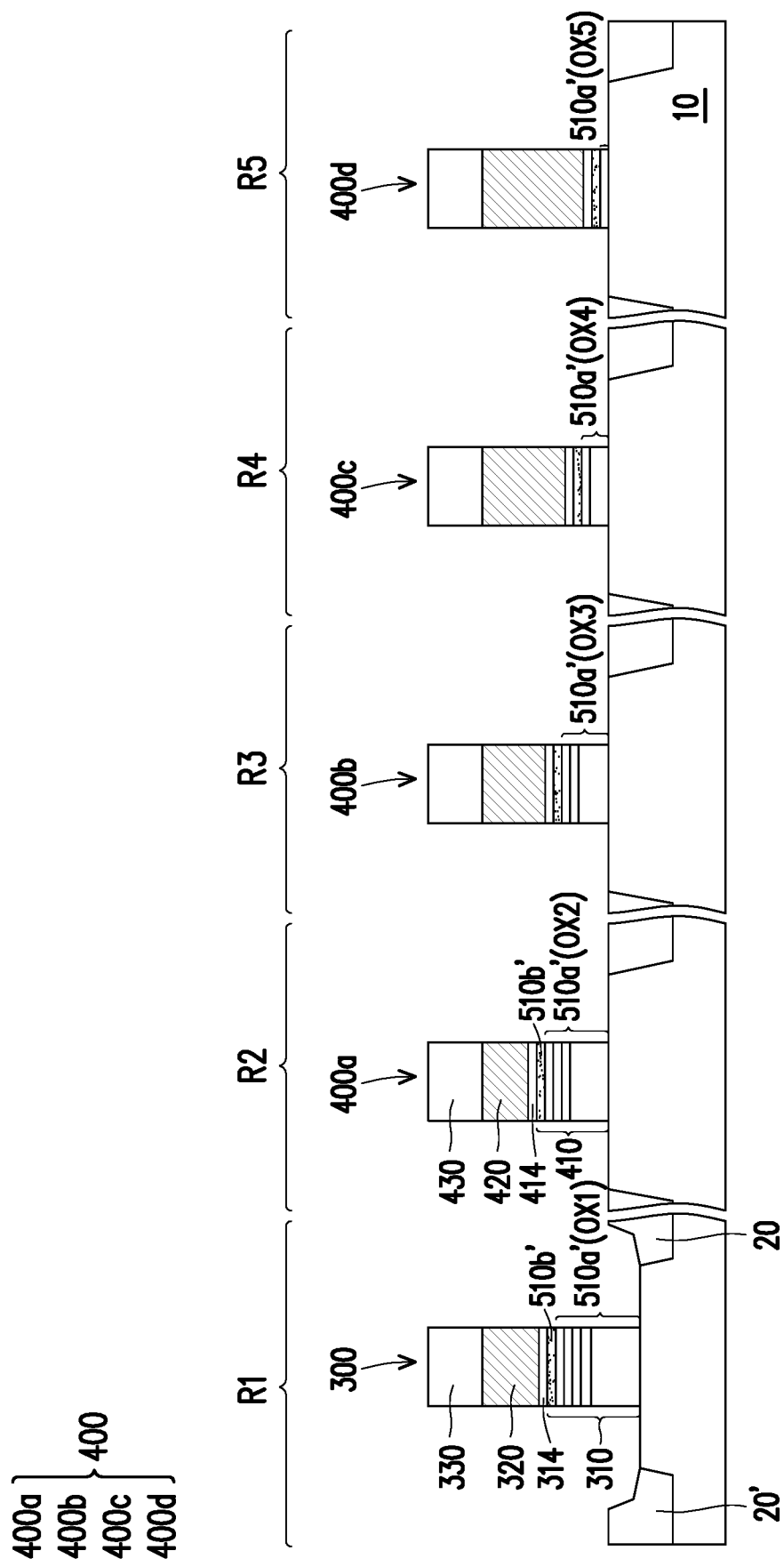

FIG. 4A to 4B are a cross sectional views illustrating stages of a sequential processes for manufacturing a semiconductor device including the circuit regions according to a fourth embodiment of the disclosure. For the sake of clarity, the memory cell region CR is not shown in FIGS. 4A and 4B.

In FIG. 4A, a gate dielectric layer 510, a barrier layer 514, a conductive layer 520, and a cap layer 530 are formed on the substrate 10 in the first to fifth circuit regions R1-R5. The gate dielectric layer 510 includes a silicon oxide layer 510a and a high-k dielectric layer 510b on the silicon oxide layer 510a. The silicon oxide layer 510a includes silicon oxide layers OX1, OX2, OX3, OX4 and OX5 having various thicknesses in the first to fifth circuit regions R1-R5.

The silicon oxide layers OX1, OX2, OX3, OX4 and OX5 may be formed by performing multiple thermal oxidation processes. In some embodiments, a first mask layer (not shown) is formed over the substrate 10 to cover the second to fifth circuit regions R2-R5, and expose the substrate 10 in the first circuit regions R1, and then a first thermal oxidation process is performed to form a layer L1 including a first portion P11 of a silicon oxide layer OX1 on the substrate 10 in the first circuit region R1. The layer L1 have a thickness of about 10 nm to about 30 nm, for example.

Thereafter, a second mask layer (not shown) which exposes the first circuit region R1 and the second circuit region R2 is formed over the substrate 10. In some embodiments, the second mask layer is formed by patterning the first mask layer. A second thermal oxidation process is performed to form a layer L2 including a second portion P12 on the first portion P11 of the silicon oxide layer OX1 in the first circuit region R1 and a first portion P21 of a silicon oxide layer OX2 in the second circuit region R2. The layer L2 have a thickness of about 6 nm to about 13 nm, for example.

Next, a third mask layer which exposes the first circuit region R1, the second circuit region R2 and the third circuit regions R3 is formed over the substrate 10. The third mask layer is formed by patterning the second mask layer, in some embodiments. A third thermal oxidation process is performed to form a layer L3 including a third portion P13 on the second portion P12 of the silicon oxide layer OX1 in the first circuit region R1, a second portion P22 on the first portion P21 of the silicon oxide layer OX2 in the second circuit region R2, and a first portion P31 of a silicon oxide layer OX3 in the third circuit region R3. The layer L3 have a thickness of about 3 nm to about 7 nm, for example.

A fourth mask layer which exposes the first circuit regions R1 to the fourth circuit regions R4 is formed over the substrate 10. The fourth mask layer is formed by patterning the third mask layer. A fourth thermal oxidation process is performed to form a layer L4 including a fourth portion P14 on the third portion P13 of the silicon oxide layer OX1 in the first circuit region R1, a third portion P23 on the second portion P22 of the silicon oxide layer OX2 in the second circuit region R2, a second portion P32 on the first portion P31 of the silicon oxide layer OX3 in the third circuit region R3, and a first portion P41 of a silicon oxide layer OX4 in the fourth circuit region R4. The layer L4 have a thickness of about 2 nm to about 4 nm, for example.

A fifth mask layer, which exposes the first circuit regions R1 to the fifth circuit regions R5, is formed over the substrate 10. The fifth mask layer is formed by patterning the fourth mask layer. A fifth thermal oxidation process is performed to form a layer L5 including a fifth portion P15 on the fourth portion P14 of the silicon oxide layer OX1 in the first circuit region R1, a fourth portion P24 on the third portion P23 of the silicon oxide layer OX2 in the second circuit region R2, a third portion P33 on the second portion P32 of the silicon oxide layer OX3 in the third circuit region R3, a second portion P42 on the first portion P41 of the silicon oxide layer OX4 in the fourth circuit region R4, and a silicon oxide layer OX5 in the fifth circuit region R5. Since the first circuit region R1 is recessed as set forth above, the difference in the thickness between the first circuit region R1 and the other regions R2-R5 may be reduced, even though the first circuit region R1 has the thickest silicon oxide layer OX1. The layer L5 have a thickness of about 2 nm to about 4 nm, for example.

Although FIG. 4A illustrates the silicon oxide layer 510a includes different layers L1 to L5, when the materials of the adjacent layer are the same (e.g., silicon oxide), there is no interface between the adjacent layers. In other words, two or more layers are observed as one layer.

A high-k dielectric layer 510b is formed on the silicon oxide layer 510a. The high-k dielectric layer 510b has dielectric constant greater than silicon oxide or greater than 4. The high-k dielectric layer 510b includes oxides and/or silicates of Hf, Al, Zr, La, Mg, Ba, Ti, and other metals, silicon nitride, silicon oxide, and the like, or combinations thereof. The high-k dielectric layer 510b includes hafnium oxide (HfO), hafnium silicon oxide (HfSiO), hafnium aluminum oxide (HfAlO), or hafnium tantalum oxide (HfTaO), for example. However, the disclosure is not limited thereto.

A barrier layer 514 is formed on the high-k dielectric layer 510b. In some embodiments, the barrier layer 514 includes TiN, TaN, TaC, the like, or a combination thereof, and is formed by a CVD process, a physical vapor deposition (PVD) process, ALD process, or any suitable deposition process.

A conductive layer 520 is formed over the barrier layer 514 as shown in FIG. 4. The conductive layer 520 includes one or more layers of metal material, such as Al, Cu, Ti and/or TiN, or a polysilicon. The conductive layer 520 may be formed by a PVD or a CVD. A cap layer 530 is formed over the conductive layer 520. The cap layer 530 includes silicon oxide, silicon nitride, silicon oxynitride, combination thereof formed by a CVD. In some embodiments, before the cap layer 530 is formed, the conductive layer 520 is planarized by a CMP process. In other some embodiments, before the cap layer 530 is formed, the conductive layer 520 is not planarized by a CMP process. The conductive layer 520 has different thicknesses in the first to fifth circuit regions R1-R5, and the cap 530 has the same thicknesses in the first to fifth circuit regions R1-R5. In some embodiments, after the cap layer 530 is formed, the cap layer 530 is planarized by a CMP process. In other some embodiments, after the cap layer 530 is formed, the cap layer 530 is not planarized by a CMP process. The conductive layer 520 has the same thicknesses in the first to fifth circuit regions R1-R5, and the cap layer 530 has different thicknesses in the first to fifth circuit regions R1-R5.

Referring to FIG. 4B, the cap layer 530, the conductive layer 520, the barrier layer 514, the gate dielectric layer 510 are patterned by using lithography and etching processes, thereby a gate structure 300 is formed on the substrate 10 in the first circuit region R1 and a plurality of dummy gate structures 400 (e.g. 400a, 400b, 400c, and 400d) are formed on the substrate 10 in the second to fifth circuit regions R2-R5. In detail, the gate structure 300 includes a gate dielectric layer 310, a barrier layer 314, a gate electrode 320, and a cap layer 330. The gate dielectric layer 310 includes a patterned silicon oxide layer 510a' and a patterned high-k dielectric layer 510b' on the patterned silicon oxide layer 510a' in the first circuit region R1. The gate electrode 320 is formed between the barrier layer 314 and the cap layer 330. In addition, one of the dummy gate structures 400 includes a gate dielectric layer 410, a barrier layer 414, a dummy gate electrode 420, and a cap layer 430. The gate dielectric layer 410 includes the patterned silicon oxide layer 510a' and the patterned high-k dielectric layer 510b' on the patterned silicon oxide layer 510a' in one of the circuit regions R2-R5. The dummy gate electrode 420 is formed between the barrier layer 414 and the cap layer 430.

FIG. 5A to FIG. 5J are cross sectional views illustrating various stages of a sequential process for manufacturing a semiconductor device including a memory cell region and circuit regions according to a fifth embodiment of the disclosure.

Figure 5A:
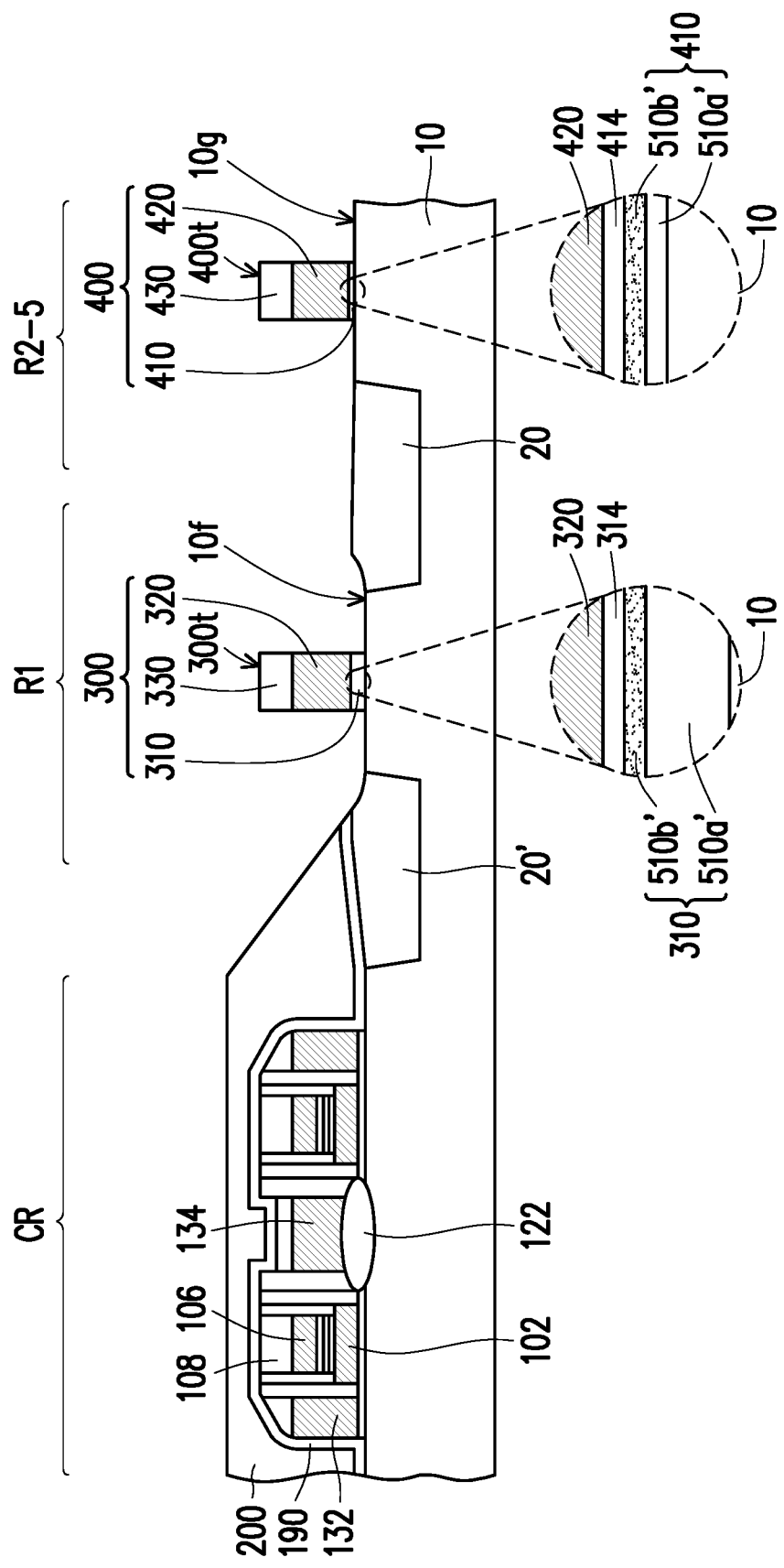
FIG. 5A to FIG. 5J are cross sectional views illustrating various stages of a sequential process for manufacturing a semiconductor device including a memory cell region and circuit regions according to a fifth embodiment of the disclosure.

FIG. 5A is substantially equivalent to FIG. 4B. In FIG. 4B, the memory cell region CR is not shown, and the plurality of dummy gate structure 400 (e.g. 400a, 400b, 400c, and 400d) are shown in the second to fifth circuit regions R2-R5, while in FIG. 5A, the memory cell region CR is shown and only one of the dummy gate structures 400 is shown in the second to fifth circuit regions R2-R5.

Referring to FIG. 5A, the surface 10f of the substrate 10 in the first circuit region R1, which the gate structure 300 is formed thereon, is lower than the surface 10g of the substrate 10 in the second to fifth circuit regions R2-R5, which the dummy gate structures 400 are formed thereon, and a thickness of the gate dielectric layer 310 is greater than a thickness of the gate dielectric layer 410. In some embodiments, the gate electrode 320 and the dummy gate electrode 420 are formed by a same operation. That is, the gate electrode 320 and the dummy gate electrode 420 have a same thickness and a same material, such as polysilicon. In some alternative embodiments, the gate electrode 320 and the dummy gate electrode 420 have different thicknesses.

In alternative embodiments, the first circuit region R1 is disposed to have the same surface level as the memory cells MC. The HV devices in the first circuit region R1 may be formed in the left side of the boundary BL shown in FIG. 2D.

Figure 5B:
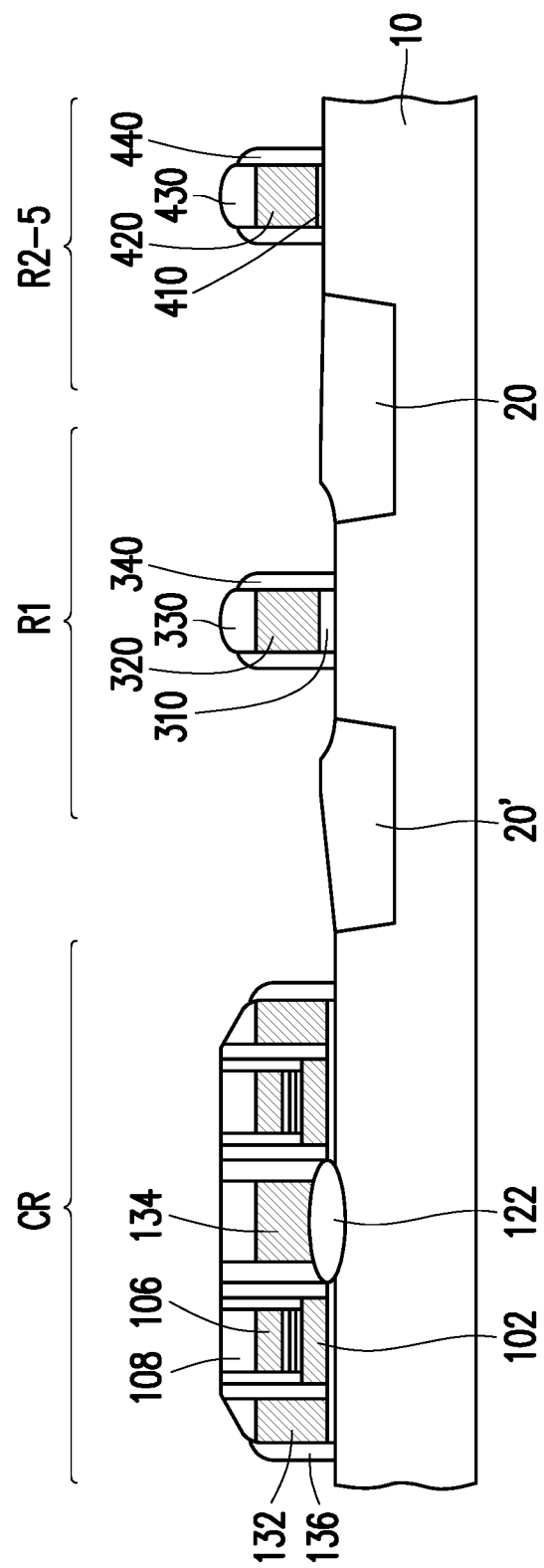
Figure 5C:
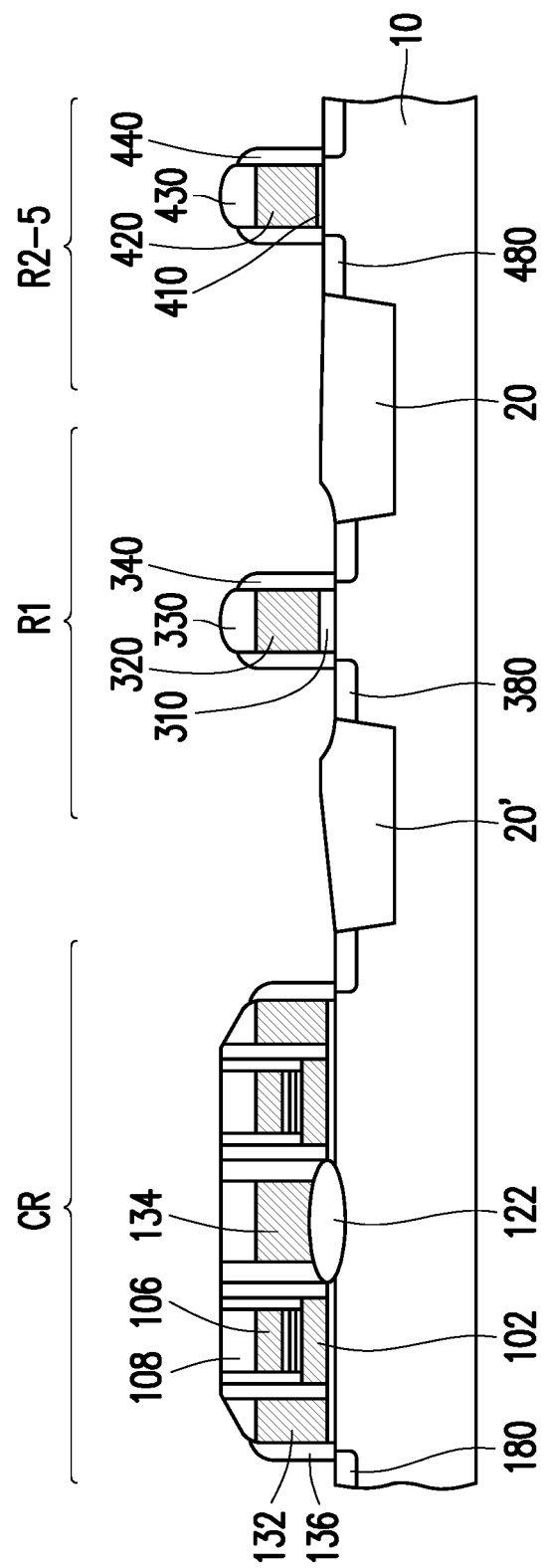

Then, the cover layer 200 in the memory cell region CR is removed as shown in FIG. 5B. Further, sidewall spacers 136 are formed for the memory cell MC in the memory cell region CR, and sidewall spacers 340 for FET in the first circuit region R1, sidewall spacers 440 for the FETs in the second to fifth circuit regions R2-R5. Thereafter, source/drain regions 180 for the memory cell MC in the memory cell region CR, source/drain regions 380 for the FET in the first circuit region R1, source/drain regions 480 for the FETs in the second to fifth circuit regions R2-R5 as shown in FIG. 5C. The source/drain regions 180, 380 and 480 may be formed by ion implantations using masks. The source/drain regions 180, 380 and 480 may be an N-type doped region for N-type FET or a P-type doped region for P-type FET, respectively.

Figure 5D:
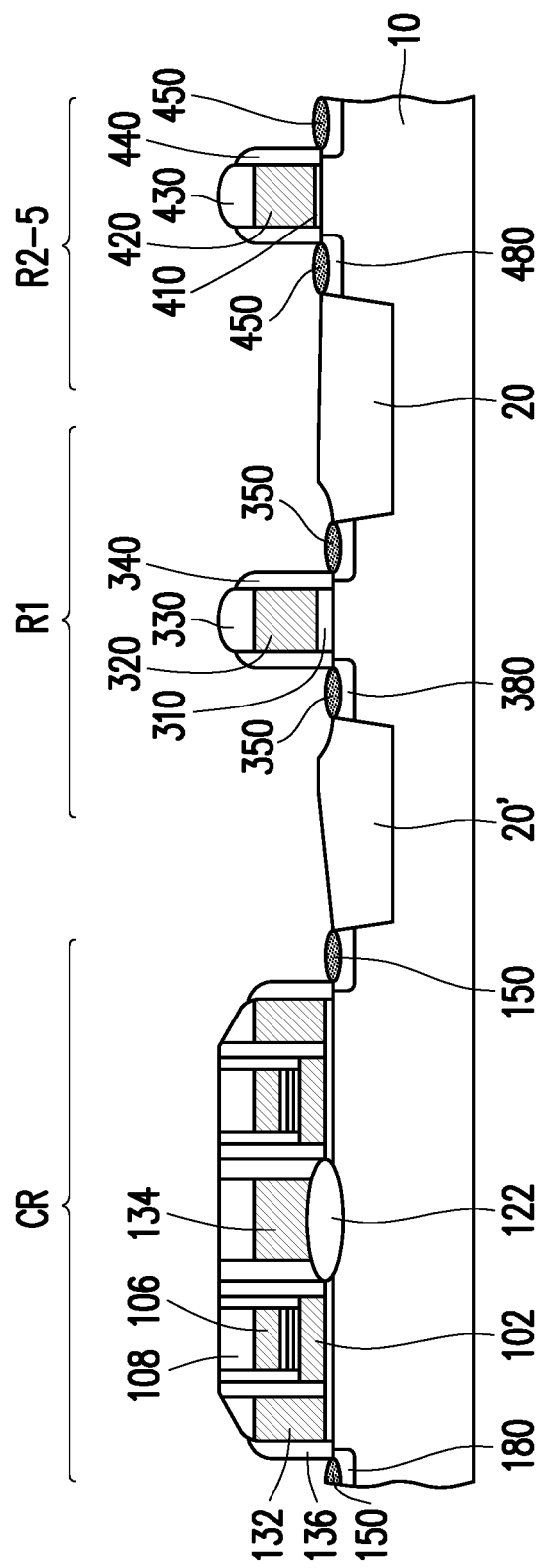
Figure 5E:
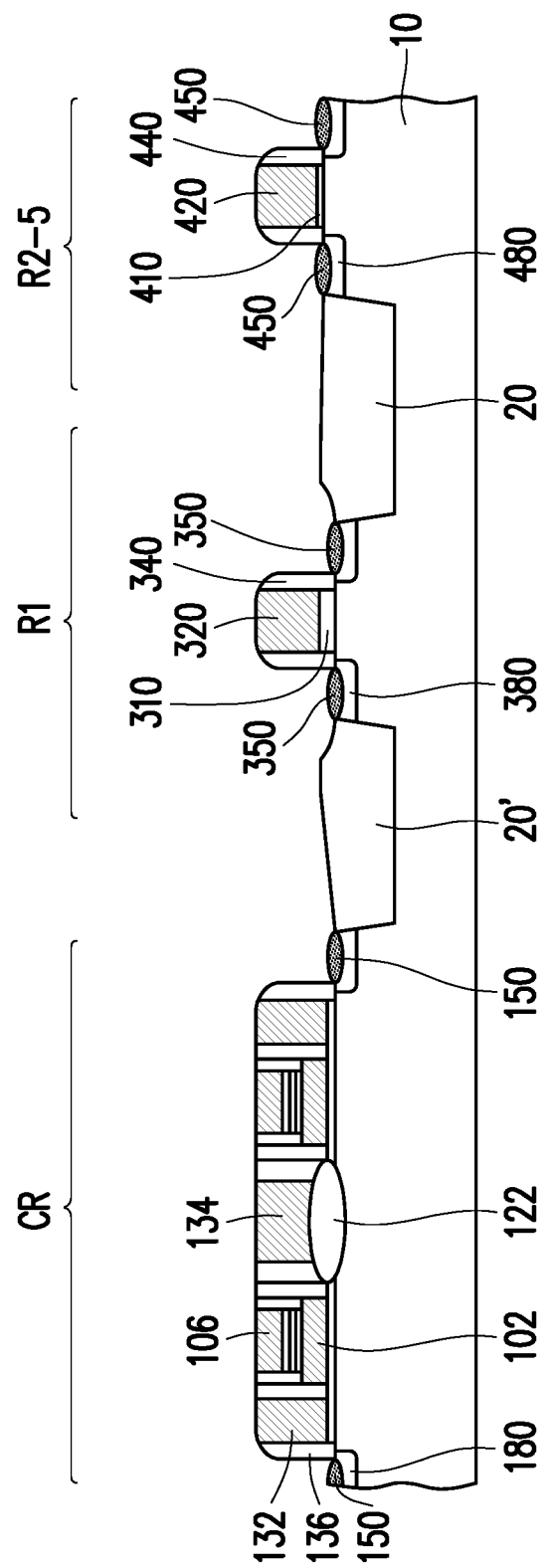
Figure 5F:
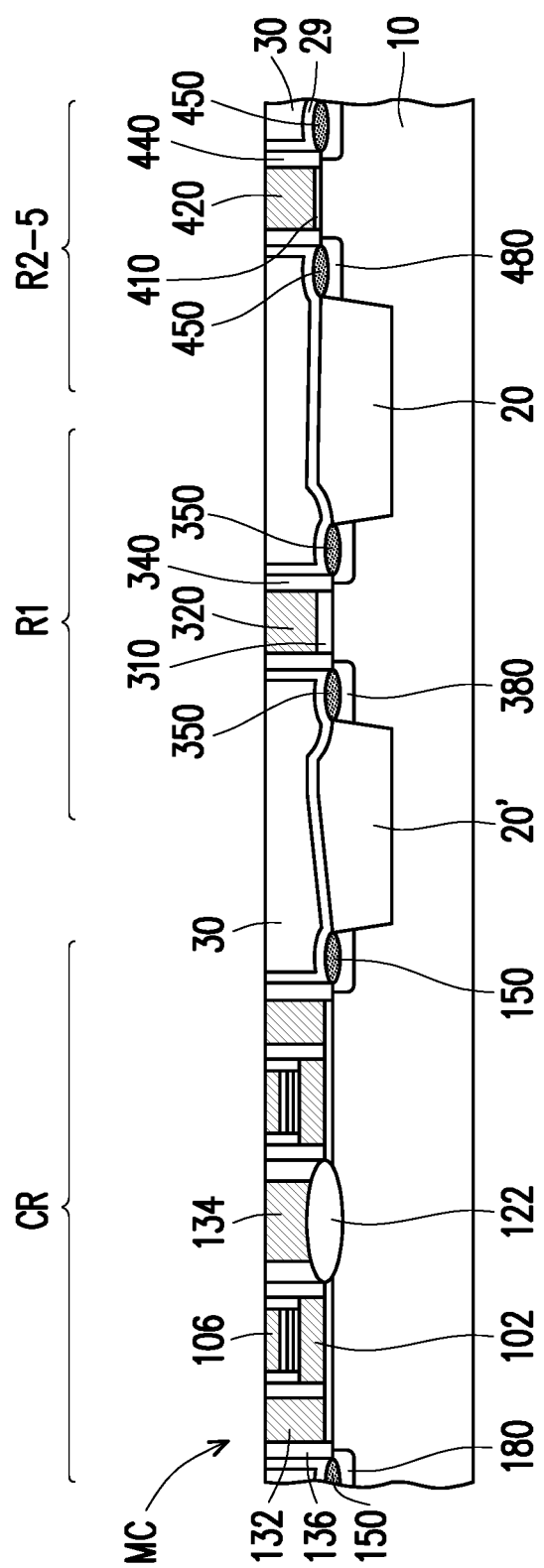

Next, as shown in FIG. 5D, metal silicide layers 150 are formed in the source/drain regions 180 in the memory cell region CR, metal silicide layers 350 are formed in the source/drain regions 380 for the FET in the first circuit region R1, and metal silicide layers 450 are formed in the source/drain regions 480 for the FETs in the second to fifth circuit regions R2-R5. As shown in FIG. 5E, the mask layers (e.g., the second insulating layer 108) in the memory cell region CR and the cap layers 330, 430 are removed. Subsequently, an ILD layer 30 is formed, and a CMP operation is performed to expose the gate electrode 320, the dummy gate electrodes 420, the select gates 132, the control gates 106 and the erase gates 134, as shown in FIG. 5F. The ILD layer 30 may include silicon oxide, silicon nitride, silicon oxynitride, the like or a combination thereof formed by any suitable method, e.g., CVD, ALD, and the like. The ILD layer 30 may is formed by depositing a dielectric material over the substrate 10, and then planarizing the dielectric material. In some embodiments, before the dielectric layer 30 is formed, an etch stop layer (or referred to as a contact etching stop layer, CESL) 29 is formed over the substrate 10. The etch stop layer 29 and the ILD layer 30 may have different materials. The etch stop layer 29 may include silicon oxide, silicon nitride, silicon oxynitride, the like or a combination thereof formed by any suitable method, e.g., CVD, ALD, and the like.

Figure 5G:
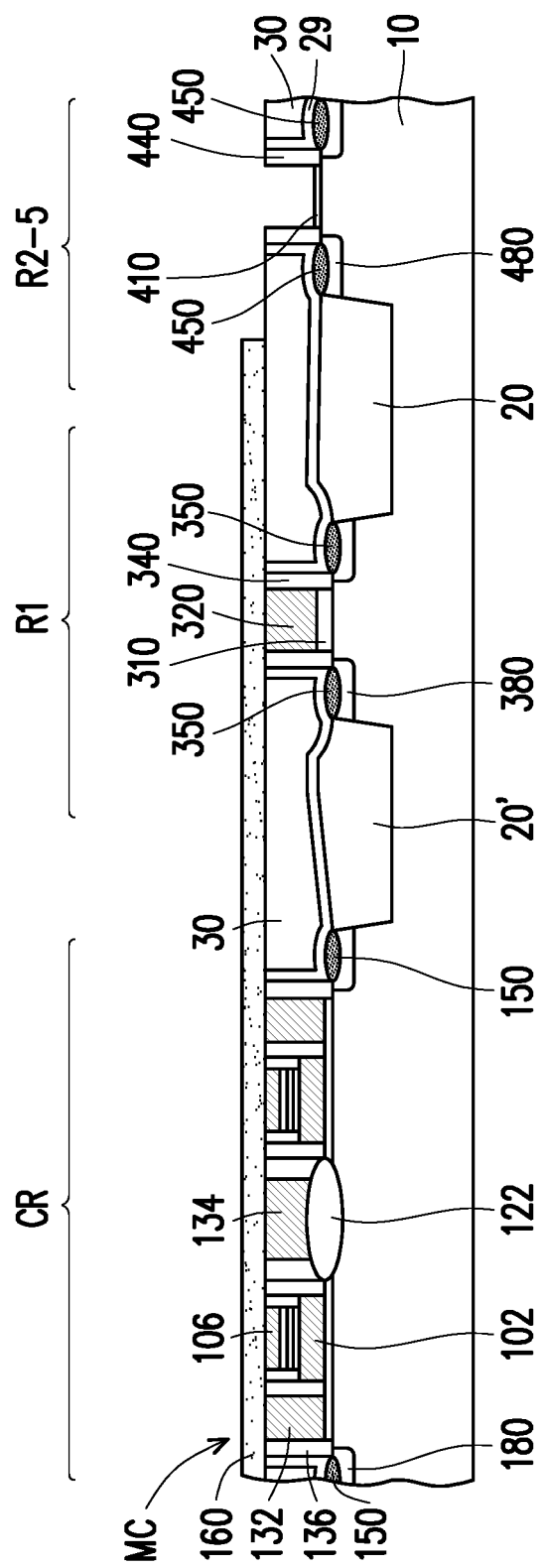

Referring to FIG. 5F and FIG. 5G, a mask pattern 160 is formed over the substrate 10. The mask pattern 160 covers the gate electrode 320 in the first circuit region R1 and the select gates 132, the control gates 106 and the erase gates 134 in the memory cell region CR, while exposes the dummy gate electrodes 420 in the second to fifth circuit regions R2-R5. Thereafter, the dummy gate electrodes 420 are removed, as shown in FIG. 5G. After the mask pattern 160 is removed, one or more conductive metal layers are formed as metal gate electrodes 520, as shown in FIG. 5G and FIG. 5H.

In some embodiments, the metal gate electrode 520 may include a metal-containing conductive layer. The metal-containing conductive layers includes a barrier, a work function layer, a seed layer, an adhesion layer, a barrier layer, a filter layer, a metal filling layer or a combination thereof. The metal-containing conductive layers include Al, Cu, W, Ti, Ta, Ag, Ru, Mn, Zr, TiAl, TiN, TaN, WN, TiAlN, TaC, TaCN, TaSiN, TiSiN, NiSi, CoSi, or a combination thereof, for example. The metal-containing conductive layer is formed by forming metal-containing conductive material, and a chemical mechanical polishing (CMP) process, an etching process, or other suitable processes.

Figure 5H:
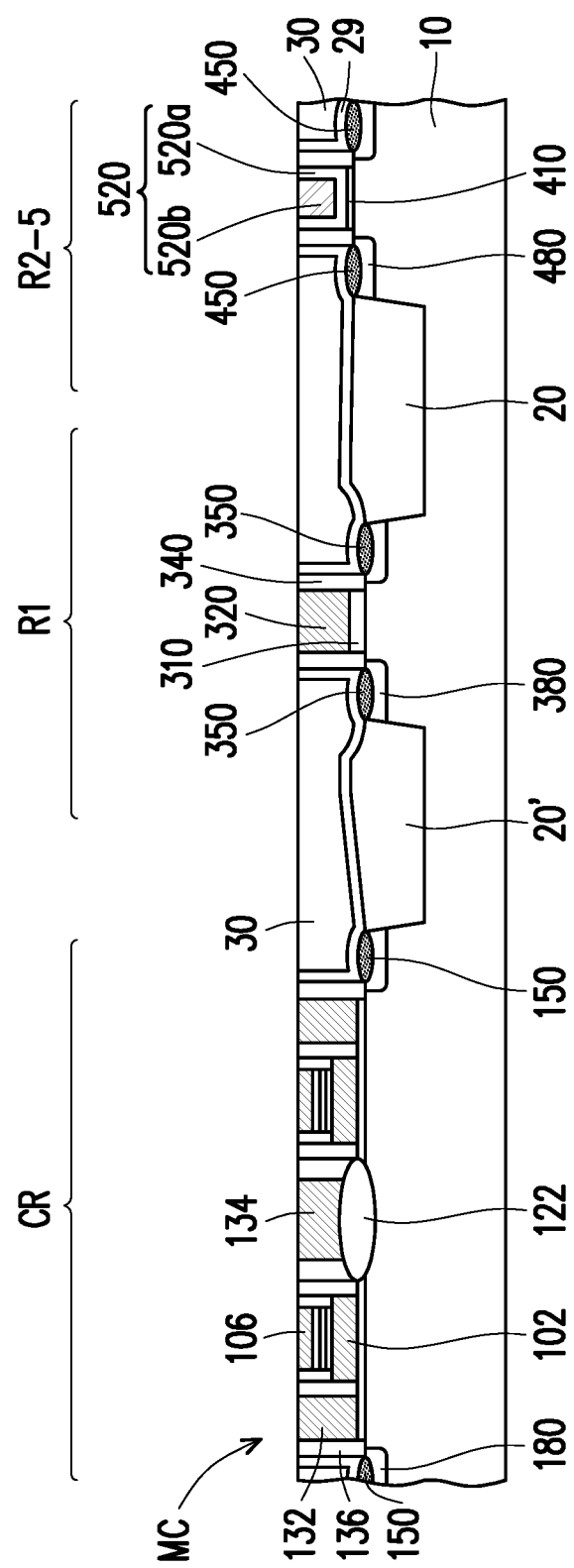

In some alternative embodiments, as shown in FIG. 5H, the metal gate electrode 520 may include a lower portion 520a and an upper portion 520b over the lower portion 520a. In FIG. 5H, the lower portion 520a has a U-shape cross section. The upper portion 520b is formed over the lower portion 520a and surrounded by the lower portion 520a. In some embodiments, the lower portion 520a may include a work function material, such as a P-type work function material and/or a N-type work function material. The P-type work function material may include TiN, TaN, Ru, Mo, Al, WN, ZrSi$_2$, MoSi$_2$, TaSi$_2$, NiSi$_2$, any suitable P-type work function material, or a combination thereof. The N-type work function material may include Ti, Ag, TaAl, TaAlC, TiAlN, TaC, TaCN, TaSiN, Mn, Zr, any suitable N-type work function material, or a combination thereof. The lower portion 520a is formed by a CVD process, a PECVD process, an ALD process, or any suitable process. The upper portion 520b may include a metal filling layer and is formed by a CVD process, a PVD process, the like, or any suitable process. The metal filling layer may include Al, W, Cu and/or any suitable material.

Figure 5I:
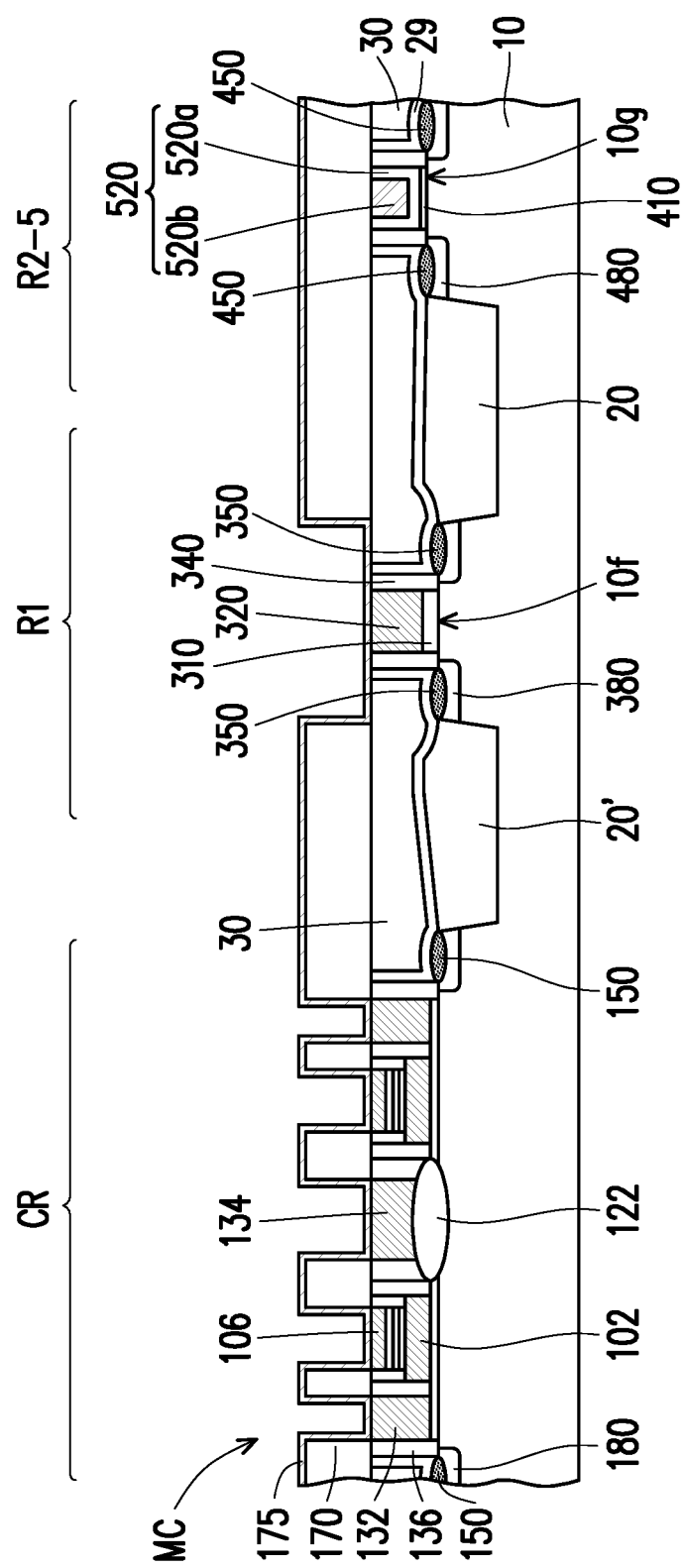
Figure 5J:
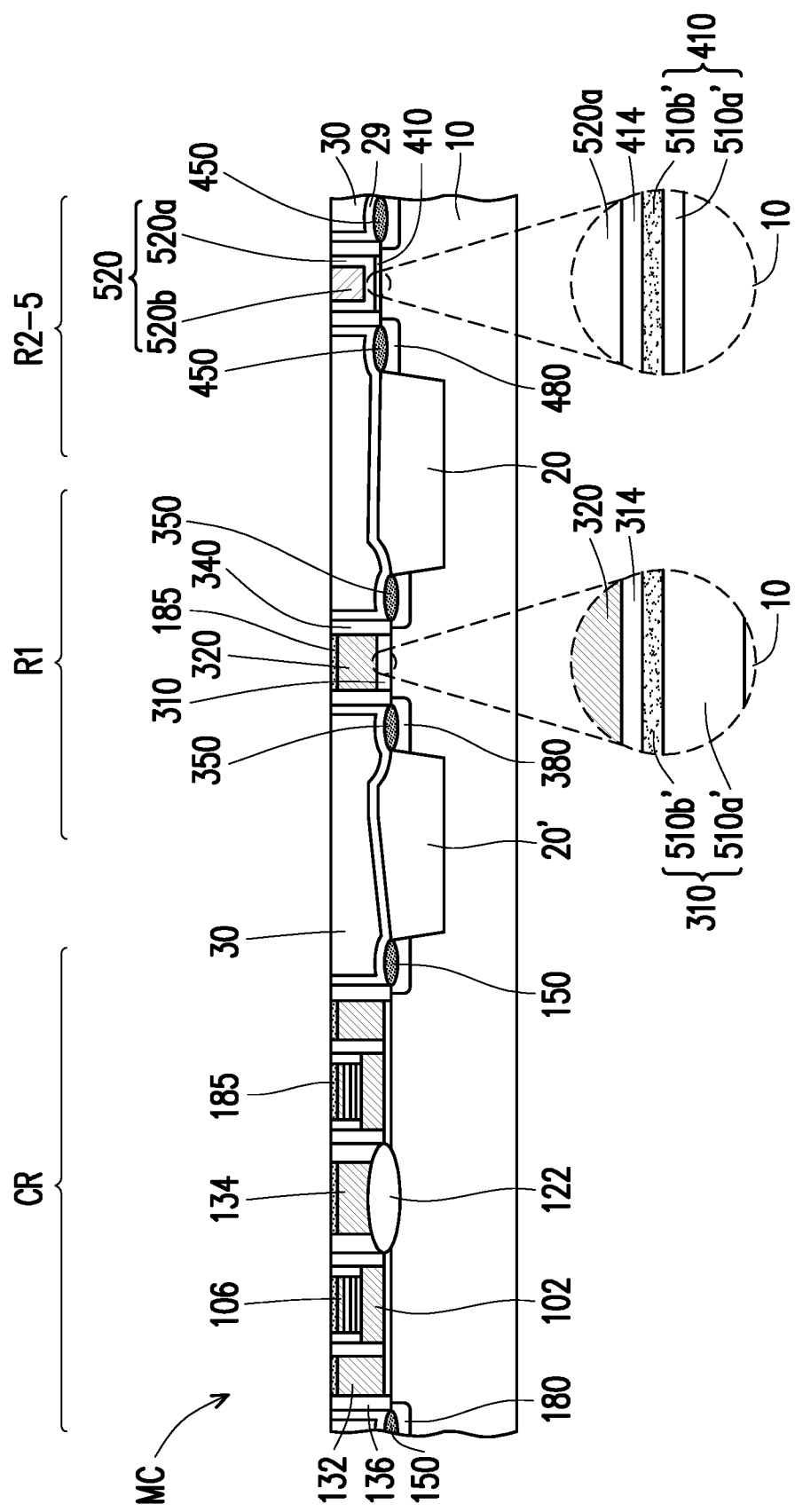

Referring to FIGS. 5H and 5I, thereafter, a block layer 170 is formed over the substrate 10. The block layer 170 covers the metal gate electrode 520 in the second to fifth circuit regions R2 to R5, while exposes the gate electrode 320 in the first circuit region R1, the select gates 132, the control gates 106 and the erase gates 134 in the memory cell region CR. The block layer 170 may be a single layer or multiple layers such as silicon oxide, silicon nitride or combinations thereof formed by CVD or ALD. Although a plurality of small openings formed in the block layer 170 in the memory cell region CR are illustrated in FIG. 5I, the disclosure is not limited thereto. In other embodiments, the small openings may be connected to one another and merged as a greater opening to expose the select gates 132, the control gates 106 and the erase gates 134 in the memory cell region CR.

A self-align silicidation process is performed to form a plurality of metal silicide layers 185 respectively on the gate electrode 320, the select gates 132, the control gates 106 and the erase gates 134. The self-align silicidation process includes forming a metal layer 175 over the substrate 10. The metal layer 175 may include cobalt, nickel, or the like formed by PVD. An annealing process is performed, so that the metal layer 175 self-aligning portions of the polysilicon gate electrode 320, the select gates 132, the control gates 106 and the erase gates 134 to form the metal silicide layers 185 respectively on the gate electrode 320 in the first circuit region R1, and the select gates 132, the control gates 106 and the erase gates 134 in the memory cell region CR. The temperature of the annealing process ranges from about 250 degrees Celsius to about 400 degrees Celsius, in some embodiments. Thereafter, the unreacted metal layer 175 and the block layer 170 are removed by etching processes.

Because the upper surface 10*f* of the substrate 10 in the first circuit region R1 is lower than the upper surfaces 10*g* of the second to fifth circuit regions R2 to R5, the gate electrode 320 has a great thickness. Thus, a portion of polysilicon gate electrode 320 remains after the salicidation process.

In accordance with some embodiments of the disclosure, a semiconductor device includes a substrate, a first FET, and a second FET formed over the substrate. The substrate has a first surface and a second surface, and the first surface and the second surface form a step. The first FET comprises a first gate dielectric layer over the first surface of the substrate. The second FET comprises a second gate dielectric layer thinner than the first gate dielectric layer over the second surface of the substrate.

In accordance with alternative embodiments of the disclosure, a semiconductor device includes a substrate, a first circuit, and a second circuit. The substrate includes a first circuit region and a second circuit region. The first circuit is formed over a first surface of the substrate in the first circuit region. The second circuit is formed over a second surface of the substrate in the second circuit region. The surface of the substrate in the first circuit region is lower than the second surface of the substrate in the second circuit region. The first circuit comprises a first gate dielectric layer and a first gate electrode over the first gate dielectric layer. The first gate electrode comprises a first lower portion and a first upper portion over the first lower portion. The first lower portion comprises polysilicon, and the first upper portion comprises metal silicide.

In accordance with some embodiments of the disclosure, a method of manufacturing a semiconductor device includes the following steps. A substrate having a first circuit region and a second circuit region is provided. The substrate in the first circuit region is recessed, while the second circuit region is protected. A first field effect transistor (FET) having a first gate dielectric layer is formed over a recessed substrate in the first circuit region and a second FET having a second gate dielectric layer over the substrate in the second circuit region. A thickness of the first gate dielectric layer is thicker than a thickness of the second gate dielectric layer.

The foregoing outlines features of several embodiments so that those skilled in the art may better understand the aspects of the disclosure. Those skilled in the art should appreciate that they may readily use the disclosure as a basis for designing or modifying other processes and structures for carrying out the same purposes and/or achieving the same advantages of the embodiments introduced herein. Those skilled in the art should also realize that such equivalent constructions do not depart from the spirit and scope of the disclosure, and that they may make various changes, substitutions, and alterations herein without departing from the spirit and scope of the disclosure.

What is claimed is:

1. A semiconductor device, comprising:
   a substrate having a first surface and a second surface, wherein the first surface and the second surface form a step; and
   a first field effect transistor (FET) formed over the substrate, wherein the first FET comprises:
      a first gate dielectric layer over the first surface of the substrate;
      a polysilicon gate electrode over the first gate dielectric layer; and
      a first barrier layer between the first gate dielectric layer and the polysilicon gate electrode;
   a second FET formed over the substrate, wherein the second FET comprises a second gate dielectric layer thinner than the first gate dielectric layer over the second surface of the substrate.

2. The semiconductor device of claim 1, wherein a top surface of the first gate dielectric layer is lower than a top surface of the second gate dielectric layer.

3. The semiconductor device of claim 2, wherein the polysilicon gate electrode comprises a first lower portion and a first upper portion over the first lower portion,
   the first lower portion comprises polysilicon and the first upper portion comprises metal silicide.

4. The semiconductor device of claim 1, wherein the second FET further comprises a metal gate electrode over the second gate dielectric layer, the metal gate electrode comprises a second lower portion and a second upper portion over the second lower portion,
   the second lower portion comprises work function material, the second upper portion comprises metal, and a top surface of the metal gate electrode is coplanar with a top surface of the polysilicon gate electrode.

5. The semiconductor device of claim 1, wherein a first operation voltage of the first FET is higher than a second operation voltage of the second FET.

6. A semiconductor device, comprising:
   a substrate comprising a first circuit region and a second circuit region;
   a first circuit formed over a first surface of the substrate in the first circuit region, wherein the first circuit comprises a first gate dielectric layer and a first gate electrode over the first gate dielectric layer, the first gate electrode comprises a first lower portion and a first upper portion over the first lower portion, the first lower portion comprises polysilicon and the first upper portion comprises metal silicide; and
   a second circuit formed over a second surface of the substrate in the second circuit region, wherein the second circuit at least comprises a second gate electrode with metal, and the first surface is lower than the second surface.

7. The semiconductor device of claim 6, wherein a first thickness of the first gate dielectric layer is greater than a second thickness of the second gate dielectric layer.

8. The semiconductor device of claim 7, wherein a step between the first surface and the second surface is equal to or greater than a difference between the first thickness and the second thickness.

9. The semiconductor device of claim 6, wherein the second circuit further comprises a second gate dielectric layer and the second gate electrode over the second gate dielectric layer, the second gate electrode comprises a second lower portion and a second upper portion over the second lower portion, the second lower portion comprises work function material, the second upper portion comprises metal.

10. The semiconductor device of claim 9, wherein, a top surface of the second gate electrode is coplanar with a top surface of the first gate electrode.

11. The semiconductor device of claim 6, further comprising a memory cell formed over a third surface of the substrate in a memory cell region, wherein the third surface of the substrate is at a same level as the first surface of the substrate.

12. The semiconductor device of claim 6, further comprising a memory cell formed over a third surface of the substrate in a memory cell region, wherein the first surface of the substrate is higher than the third surface of the substrate.

13. The semiconductor device of claim 6, wherein
the first circuit comprises a high-voltage (HV) circuit operating at the first voltage; and
the second circuit comprises an analog circuit, an I/O circuit, a word line (WL) driver circuit, or a core logic circuit operating at the second voltage.

14. A method of manufacturing a semiconductor device, comprising:
providing a substrate having a first circuit region and a second circuit region;
recessing the substrate in the first circuit region, while the second circuit region is protected; and
forming a first field effect transistor (FET) having a first gate dielectric layer over a recessed substrate in the first circuit region and a second FET having a second gate dielectric layer over the substrate in the second circuit region, wherein a thickness of the first gate dielectric layer is thicker than a thickness of the second gate dielectric layer,
wherein the first FET further comprises a polysilicon gate electrode over the first gate dielectric layer, and the second FET further comprises the metal gate electrode over the second gate dielectric layer.

15. The method of claim 14, the recessing the substrate in the first circuit region comprises:
forming a mask pattern, wherein the first circuit region is exposed by an opening of the mask pattern, while the second circuit region is covered by the mask pattern;
forming an oxide layer on the substrate in the first circuit region by wet oxidation;
removing the oxide layer by wet etching; and
removing the mask pattern.

16. The method of claim 14, the recessing the substrate in the first circuit region comprises:
forming a mask pattern, wherein the first circuit region is exposed by an opening of the mask pattern, while the second circuit region is covered by the mask pattern;
etching the substrate by dry etching; and
removing the mask pattern.

17. The method of claim 14, wherein the forming the first FET comprises forming a first gate electrode over the first gate dielectric layer, the forming the second FET comprises forming a second gate electrode over the second gate dielectric layer, and a top surface of the first gate electrode is coplanar with a top surface of the second gate electrode.

18. The method of claim 14, further comprising:
forming a block layer over the substrate, wherein the block layer covers the second circuit region and exposes the first second circuit region;
performing a salicidation on the first gate electrode to form a metal silicide layer on the first gate electrode; and
removing the block layer.

19. The semiconductor device of claim 1, wherein the first gate dielectric layer comprises a bottom portion and a top portion over the bottom portion, the top portion has a high-k dielectric material with a dielectric constant greater than that of the bottom portion, and the top portion is in direct contact with the first barrier layer.

20. The semiconductor device of claim 6, wherein the first circuit further comprises a first barrier layer between the first gate dielectric layer and the first gate electrode.

* * * * *